US006977571B1

(12) United States Patent
Hollis et al.

(10) Patent No.: US 6,977,571 B1
(45) Date of Patent: Dec. 20, 2005

(54) SECONDARY COIL CIRCUIT FOR USE WITH A MULTI-SECTION PROTECTED SUPERCONDUCTIVE MAGNET COIL CIRCUIT

(75) Inventors: Timothy James Hollis, Bicester (GB); Peter J. Feenan, Freeland (GB)

(73) Assignee: General Electric Company, Schenectady, NY (US)

(*) Notice: Subject to any disclaimer, the term of this patent is extended or adjusted under 35 U.S.C. 154(b) by 28 days.

(21) Appl. No.: 10/983,399

(22) Filed: Nov. 8, 2004

(51) Int. Cl.[7] .............................. H02H 9/00; H01F 7/22
(52) U.S. Cl. ...................... 335/216; 335/299; 335/301; 324/319; 324/320; 361/19
(58) Field of Search ............................... 335/216, 299, 335/301; 324/318–320; 361/19

(56) References Cited

U.S. PATENT DOCUMENTS

| 4,680,545 | A |   | 7/1987 | Gray et al. |
| 4,689,707 | A | * | 8/1987 | Schwall ...................... 361/19 |
| 4,764,837 | A |   | 8/1988 | Jones |
| 5,210,512 | A |   | 5/1993 | Davies |
| 5,329,266 | A |   | 7/1994 | Soeldner et al. |
| 5,627,709 | A |   | 5/1997 | Salasoo |
| 5,731,939 | A |   | 3/1998 | Gross et al. |
| 5,739,997 | A |   | 4/1998 | Gross |
| 5,757,257 | A |   | 5/1998 | Doi et al. |
| 6,147,844 | A |   | 11/2000 | Huang et al. |
| 6,265,960 | B1 |   | 7/2001 | Schauwecker et al. |
| 6,496,091 | B2 |   | 12/2002 | Schauwecker et al. |
| 6,563,316 | B2 |   | 5/2003 | Schauwecker et al. |
| 6,717,781 | B2 |   | 4/2004 | Xu et al. |
| 6,781,494 | B2 |   | 8/2004 | Schauwecker et al. |

* cited by examiner

*Primary Examiner*—Ramon M. Barrera

(57) ABSTRACT

A secondary coil circuit for use with a multi-section protected superconductive magnet coil circuit is disclosed herein. The secondary coil circuit includes two circuit nodes, a ramping switch electrically connected between the two circuit nodes, and a number of secondary coils electrically connected between the two circuit nodes. The secondary coils are made of wire having substantially superconductive capability when cooled below a characteristic critical temperature level and conducting electric current below a characteristic critical current level. The secondary coils are sized and positioned relative to the superconductive magnet coils situated in the individual sections of the multi-section protected superconductive magnet coil circuit so as to functionally cooperate with the multi-section protected superconductive magnet coil circuit in producing and maintaining a magnetic field that is substantially homogeneous. In one embodiment, the secondary coil circuit is inductively decoupled from each individual section of the multi-section protected superconductive magnet coil circuit.

27 Claims, 14 Drawing Sheets

| PHYSICAL DIMENSIONS AND CHARACTERISTICS OF ORIGINAL Z2 SHIM COILS INCORPORATED IN SHIM CIRCUIT | | | | | | | | |
|---|---|---|---|---|---|---|---|---|
| ORIGINAL Z2 SHIM COIL (IDENTIFIED BY #) | A1 (CM) | A2 (CM) | B1 (CM) | B2 (CM) | TD (/CM²) | # OF TURNS | LENGTH (M) | # OF LAYERS |
| Z2 SHIM COIL 1 | 88.00 | 88.33 | -85.32 | -80.70 | -330.58 | -504.0 | -2791.9 | 6 |
| Z2 SHIM COIL 2 | 88.00 | 88.33 | -30.95 | -26.00 | 330.58 | 540.0 | 2991.4 | 6 |
| Z2 SHIM COIL 3 | 88.00 | 88.33 | 26.00 | 30.95 | 330.58 | 540.0 | 2991.4 | 6 |
| Z2 SHIM COIL 4 | 88.00 | 88.33 | 80.70 | 85.32 | -330.58 | -504.0 | -2791.9 | 6 |

FIG. 8

PERFORMANCE RESULTS OF SHIM CIRCUIT INCORPORATING ORIGINAL Z2 SHIM COILS

STRENGTH LEVELS OF MAGNETIC FIELD IN ORIGINAL Z2 SHIM COILS

| ORIGINAL Z2 SHIM COIL (IDENTIFIED BY #) | MAGNETIC FLUX DENSITY PER UNIT OF ELECTRIC CURRENT (IN GAUSS PER AMPERE) | PEAK MAGNETIC FLUX DENSITY OR "PEAK FIELD" (IN TESLAS) |
|---|---|---|
| Z2 SHIM COIL 1 | N/A | N/A |
| Z2 SHIM COIL 2 | N/A | N/A |
| Z2 SHIM COIL 3 | $-3.098 \times 10^{-1}$ GAUSS/A | 0.41 T |
| Z2 SHIM COIL 4 | $-1.936 \times 10^{-1}$ GAUSS/A | 1.53 T |

HOMOGENEITY OF MAGNETIC FIELD (IN PARTS-PER-MILLION PER AMPERE):

-7.19 PPM/A OVER A 22.5-CENTIMETER RADIUS SPHERICAL VOLUME (OR 45-CM DSV)

LEVELS OF MUTUAL INDUCTANCE (IN HENRIES) BETWEEN INDIVIDUAL SECTIONS OF MAGNET COIL CIRCUIT AND SHIM CIRCUIT DURING A QUENCH EVENT IN THE MAGNET COIL CIRCUIT

| BETWEEN | MUTUAL INDUCTANCE |
|---|---|
| SECTION 1 OF MAGNET COIL CIRCUIT AND SHIM CIRCUIT | 1.685 H |
| SECTION 2 OF MAGNET COIL CIRCUIT AND SHIM CIRCUIT | 2.014 H |
| SECTION 3 OF MAGNET COIL CIRCUIT AND SHIM CIRCUIT | 2.065 H |
| SECTION 4 OF MAGNET COIL CIRCUIT AND SHIM CIRCUIT | -0.512 H |
| SECTION 5 OF MAGNET COIL CIRCUIT AND SHIM CIRCUIT | 2.935 H |
| SECTION 6 OF MAGNET COIL CIRCUIT AND SHIM CIRCUIT | -2.758 H |
| SECTION 7 OF MAGNET COIL CIRCUIT AND SHIM CIRCUIT | -2.999 H |
| SECTION 8 OF MAGNET COIL CIRCUIT AND SHIM CIRCUIT | -2.774 H |

PEAK LEVEL OF ELECTRIC CURRENT (IN AMPERES) INDUCED IN SHIM CIRCUIT DURING A QUENCH EVENT IN THE MAGNET COIL CIRCUIT:

PEAK $I_{SHIM} \approx -330$ A

FIG. 9

| PHYSICAL DIMENSIONS AND CHARACTERISTICS OF MODIFIED Z2 SHIM COILS INCORPORATED IN SHIM CIRCUIT | | | | | | | | |
|---|---|---|---|---|---|---|---|---|
| MODIFIED Z2 SHIM COIL (IDENTIFIED BY #) | A1 (CM) | A2 (CM) | B1 (CM) | B2 (CM) | TD (/CM²) | # OF TURNS | LENGTH (M) | # OF LAYERS |
| Z2 SHIM COIL 1 | 88.00 | 88.33 | -69.50 | -64.11 | -330.58 | -588.0 | -3257.3 | 6 |
| Z2 SHIM COIL 2 | 88.00 | 88.33 | -23.78 | -20.20 | 330.58 | 390.0 | 2160.4 | 6 |
| Z2 SHIM COIL 3 | 88.00 | 88.33 | 20.20 | 23.78 | 330.58 | 390.0 | 2160.4 | 6 |
| Z2 SHIM COIL 4 | 88.00 | 88.33 | 64.11 | 69.50 | -330.58 | -588.0 | -3257.3 | 6 |
| Z2 SHIM COIL 5 | 88.00 | 88.33 | 130.80 | 133.00 | 330.58 | 240.0 | 1329.5 | 6 |
| Z2 SHIM COIL 6 | 88.00 | 88.33 | -133.00 | -130.80 | 330.58 | 240.0 | 1329.5 | 6 |

FIG. 13

PERFORMANCE RESULTS OF SHIM CIRCUIT INCORPORATING MODIFIED Z2 SHIM COILS

STRENGTH LEVELS OF MAGNETIC FIELD IN MODIFIED Z2 SHIM COILS

| MODIFIED Z2 SHIM COIL (IDENTIFIED BY #) | MAGNETIC FLUX DENSITY PER UNIT OF ELECTRIC CURRENT (IN GAUSS PER AMPERE) | PEAK MAGNETIC FLUX DENSITY OR "PEAK FIELD" (IN TESLAS) |
|---|---|---|
| Z2 SHIM COIL 1 | N/A | N/A |
| Z2 SHIM COIL 2 | N/A | N/A |
| Z2 SHIM COIL 3 | $-3.302 \times 10^{-1}$ GAUSS/A | 0.35 T |
| Z2 SHIM COIL 4 | $-2.164 \times 10^{-1}$ GAUSS/A | 0.54 T |
| Z2 SHIM COIL 5 | $4.350 \times 10^{-2}$ GAUSS/A | 2.82 T |
| Z2 SHIM COIL 6 | N/A | N/A |

HOMOGENEITY OF MAGNETIC FIELD (IN PARTS-PER-MILLION PER AMPERE):

-7.19 PPM/A OVER A 22.5-CENTIMETER RADIUS SPHERICAL VOLUME (OR 45-CM DSV)

LEVELS OF MUTUAL INDUCTANCE (IN HENRIES) BETWEEN INDIVIDUAL SECTIONS OF MAGNET COIL CIRCUIT AND SHIM CIRCUIT DURING A QUENCH EVENT IN THE MAGNET COIL CIRCUIT

| BETWEEN | MUTUAL INDUCTANCE |
|---|---|
| SECTION 1 OF MAGNET COIL CIRCUIT AND SHIM CIRCUIT | -0.271 H |
| SECTION 2 OF MAGNET COIL CIRCUIT AND SHIM CIRCUIT | -0.386 H |
| SECTION 3 OF MAGNET COIL CIRCUIT AND SHIM CIRCUIT | -0.450 H |
| SECTION 4 OF MAGNET COIL CIRCUIT AND SHIM CIRCUIT | 0.418 H |
| SECTION 5 OF MAGNET COIL CIRCUIT AND SHIM CIRCUIT | 1.109 H |
| SECTION 6 OF MAGNET COIL CIRCUIT AND SHIM CIRCUIT | -0.200 H |
| SECTION 7 OF MAGNET COIL CIRCUIT AND SHIM CIRCUIT | -0.138 H |
| SECTION 8 OF MAGNET COIL CIRCUIT AND SHIM CIRCUIT | -0.050 H |

PEAK LEVEL OF ELECTRIC CURRENT (IN AMPERES) INDUCED IN SHIM CIRCUIT DURING A QUENCH EVENT IN THE MAGNET COIL CIRCUIT:

PEAK $I_{SHIM} \approx -100$ A

FIG. 14

SECONDARY COIL CIRCUIT FOR USE WITH A MULTI-SECTION PROTECTED SUPERCONDUCTIVE MAGNET COIL CIRCUIT

FIELD OF THE INVENTION

The present invention generally relates to superconducting or superconductive magnets. The present invention more particularly relates to primary superconductive magnet coil circuits and complementary secondary coil circuits that cooperatively produce magnetic fields suitable for use in, for example, nuclear magnetic resonance (NMR) spectroscopy systems, mass spectrometer systems, magnetic resonance imaging (MRI) systems, and the like.

BACKGROUND OF THE INVENTION

Magnetic resonance imaging (MRI) systems, for example, are frequently used in hospital and other medical facilities to scan and obtain images of biological tissues within a patient. By obtaining such images, a doctor or other medical professional can indirectly observe and carefully examine an anatomic region of interest (ROI) within a patient. Upon conducting such an examination, the doctor may then accurately diagnose a patient's malady and prescribe an appropriate treatment.

To successfully scan a region of interest within a patient, a modern MRI system typically includes a plurality of energizable superconductive magnet coils. When energized with electric current, these superconductive magnet coils are utilized to create small individual magnetic fields which cooperatively form a larger overall composite magnetic field ($B_0$). By situating a patient within the magnetic field, one or more bodily regions of the patient may be scanned and imaged with supplemental help from RF transmit/receive coils and also gradient coils in the system. Although older MRI systems have traditionally incorporated resistive and permanent magnets, most modern MRI systems incorporate superconductive magnet coils with which larger magnetic fields and stronger field strengths are realizable for better imaging.

The superconductive magnet coils within a modern MRI system are generally constructed with superconductive wire. The superconductive wire itself is typically formed from a superconductive alloy material with which a characteristic "critical temperature" ($T_{CRIT}$) is inherently associated. In general, when the temperature in an operating environment is above this critical temperature, the superconductive wire characteristically behaves in a somewhat resistive (i.e., "normal") manner as it conducts electric current. When, on the other hand, the temperature in an operating environment is below this critical temperature, the superconductive wire characteristically behaves in a superconductive manner and is able to conduct electric current with almost no resistance. In general, the characteristic critical temperature inherently associated with a given type of superconductive wire is an extremely cold, cryogenic temperature. For example, a superconductive wire constructed with filamentary niobium-titanium (Nb—Ti) alloy windings has a characteristic critical temperature of about 10 K or –263° C. Thus, for such a superconductive wire to behave, operate, and conduct electric current in a preferred superconductive manner within a high-powered MRI system, the wire is situated in a super-cooled operating environment. Typically, in a modern MRI system, such a super-cooled operating environment is both established and maintained within a cryogen-filled vessel in a compartmentalized structure called a "cryostat."

In addition to being constructed from superconductive wire, the superconductive magnet coils within a modern MRI system are also electrically connected in series with superconductive wire so as to generally form a closed-loop, magnet coil circuit. By largely situating the entire magnet coil circuit within a cryogen-filled vessel and maintaining the circuit at a super-cool temperature, the entire magnet coil circuit is thereby rendered superconductive. In such a superconductive state, electric current can be introduced into the closed-loop magnet coil circuit so that the electric current circulates through the loop and magnet coils in a substantially continuous fashion with very little resistance. In this way, the electric current persists in the loop with very little dissipation over time. For this reason, this superconductive loop with electric current persistently circulating therein is sometimes referred to as a "persistent loop." By sustaining the persistent flow of electric current within the loop in this manner, small magnetic fields are respectively generated by the individual magnet coils as electric current passes through the coils. These small magnetic fields, as alluded to hereinabove, cooperatively form a larger composite magnetic field ($B_0$) which can successfully be sustained for a period of time. In sustaining such a magnetic field, the scanning of one or more tissue regions within a patient is thereby facilitated so as to ultimately help produce images of the tissue regions.

To introduce and ramp up the flow of electric current in such a superconductive magnet coil circuit for operating a modern MRI system, an activatable heater is utilized to heat a small section of superconductive wire in the loop above its characteristic critical temperature ($T_{CRIT}$). In this way, the small section of wire is rendered temporarily resistive. After such heating and successfully making a small section of the loop resistive, an electric power supply with resistive (i.e., non-superconductive) wire leads is then switchably connected to the loop in parallel with the small heated section. Upon being connected, the power supply is turned on to introduce and ramp up the flow of electric current through the magnet coils in the magnet coil circuit. Once the electric current has been ramped up to a desirable level, the heater is turned off. With the heater turned off, the small section of wire is quickly cooled down by the cryogens within the vessel that encloses the wire so that the small section of wire is again rendered superconductive. Once the small section of wire is superconductive, the electric current introduced into the loop is then able to flow virtually effortlessly through the section of wire. At this point, the output from the electric power supply may be slowly and gradually ramped down so that the electric current introduced into the loop is ultimately left circulating in a persistent manner through the magnet coils and the small section of wire of the overall superconductive magnet coil circuit. Once electric current is successfully introduced into the superconductive magnet coil circuit in this manner, the electric power supply may be switchably disconnected from the loop. In this way, the MRI system is made ready, at least in part, to scan a patient.

Sometimes, a modern MRI system must intentionally be shut down for disassembly, relocation, upgrading, replenishing burned-off cryogens, or performing general maintenance. To shut down the system, the electric current persistently circulating through the superconductive magnet coil circuit must generally be dissipated (i.e., "ramped down") to zero. To ramp down the current, an activatable heater is utilized to heat a small section of superconductive wire in the persistent loop above its characteristic critical temperature ($T_{CRIT}$). In this way, the small section of wire is rendered temporarily resistive. After heating and making a small section of the loop resistive in this manner, the electric energy within the loop may be transferred to an electric power supply that is switchably connected in parallel with the small heated section to thereby complete the shutdown. As an alternative or in addition thereto, the electric energy within the loop may also be dissipated via external diodes that are connected in parallel with the small heated section.

In emergency situations, it may be necessary to intentionally shut down an MRI system in a very short timeframe. To shut down the system, the electric current persistently circulating through the superconductive magnet coil circuit must generally be dissipated and ramped down to zero. To ramp down the current, an activatable heater is utilized to heat a section of superconductive wire in the persistent loop above its characteristic critical temperature ($T_{CRIT}$) to thereby make the wire resistive. As the resistive section of the wire progressively "grows" and enlarges while being heated in this manner, the overall loop rapidly becomes extensively resistive as well. As a result, the electric energy within the loop is soon dissipated to zero. This process of heating and thereby making some portion of the persistent loop resistive in order to quickly ramp down the current is commonly referred to as "quenching." During this process of quenching, the electric current must be carefully ramped down in a very controlled manner. The reason for such is because as the electric current is quenched, the electric and/or electromagnetic energy of the magnet coil circuit is thereby converted into significant amounts of thermal energy (i.e., heat) which is released. As this thermal energy is released and emanates from the loop circuit, surrounding liquid cryogens (for example, liquid helium) within the cryogen-filled vessel of the cryostat are commonly burned off in the form of a gas (for example, helium gas). In this gaseous form, the cryogens must either be recondensed for re-cycling and re-use or instead be altogether evacuated though a vent and later replenished. In light of such, therefore, if the electric current is ramped down and quenched too quickly or abruptly, large uncontrolled amounts of heat may suddenly be generated and emitted from the loop which could burn and permanently damage parts of the MRI system, including one or more sections of the loop itself and its magnet coils, or even other surrounding hardware. Any such permanent damage can be costly. Thus, for this reason, precision control and care must be exercised when intentionally quenching electric current in the superconductive magnet coil circuit of a modern MRI system.

Sometimes, electric current persistently circulating through the superconductive magnet coil circuit may suddenly be quenched by accident due to an unanticipated thermal disturbance which causes one or more sections of the persistent loop to become resistive. For example, in one possible scenario, mechanical stress and frictional movement of one or more superconductive magnet coils during operation may cause localized frictional heating which, if significant enough, may cause rapid and uncontrolled quenching of the electric current in the circuit. In another possible scenario, if liquid cryogens within the cryostat are not properly replenished to maintain the overall magnet coil circuit at a sufficiently cold temperature below its characteristic critical temperature ($T_{CRIT}$), one or more localized resistive "hot spots" may develop in the persistent loop which may cause rapid and uncontrolled quenching of the electric current in the magnet coil circuit. In either such scenario and in many possible others, such rapid and uncontrolled quenching is likely to cause the release and emission of significant amounts of thermal energy (for example, up to 80 mega-joules (MJ)) in the form of heat. As a consequence of such thermal energy being "dumped" in this manner, parts of the MRI system may be burned and permanently damaged, including one or more sections of the loop itself and its magnet coils, and even surrounding hardware. Hence, as with intentional quenching, accidental quenching can be damaging and costly as well.

In the past, per convention, superconductive magnet coil circuits in MRI systems have largely been constructed as single closed-loop circuits. With, however, the push in recent years for MRI systems to accommodate higher electric currents and voltages as well as generate stronger magnetic fields to facilitate improved scanning, such conventional magnet coil circuits are now somewhat more prone to suffer the deleterious effects of excessively high voltage levels between adjacent layers of coil windings and/or localized heat damage, especially if electric current in a circuit is quenched in a somewhat uncontrolled manner within only one or a few particular sections of the circuit. For example, if one of the superconductive magnet coils in a single closed-loop superconductive magnet coil circuit suddenly begins to quench, a significant amount of thermal energy will be released as electric current is dissipated while passing through the coil when the coil is in such a normal (i.e., resistive) state. In addition, as the electric current is dissipated via the coil, the strong magnetic field current-generated in that same coil will collapse, thereby dumping energy in the form of heat onto that very same coil. As a result of such a highly localized release and dumping of energy, a burning "hot spot" may develop and cause permanent damage to the coil before all of the energy in the circuit has been released and dumped. Given such single-looped magnet coil circuits' susceptibility to being damaged during a quench, various combinations of quench-inducing resistive "heaters," energy-dissipating "dump" resistors, and/or voltage-regulating diodes are now being strategically connected in parallel with (i.e., "shunted" across) the magnet coils situated in the magnet coil circuits of more recent and modern MRI systems. By connecting such various circuit elements within a magnet coil circuit in this manner, the magnet coils themselves are thereby situated and protected within multiple looped sections of the overall magnet coil circuit. Situated and protected as such, any quenching in one section of the circuit will, by design, trigger a progressive and cascading chain reaction of quenching in numerous other sections of the overall circuit. In this way, quenching of the electric current in the circuit is not effected via merely one or a few hot spots in the circuit. Instead, quenching of the electric current is effected via numerous sections in the circuit so as to more evenly distribute the releasing and dumping of thermal energy from the circuit. As a result, highly localized quenching via one or a few hot spots, which may permanently damage a magnet coil circuit, is largely prevented.

In general, to facilitate accurate scanning and imaging on an MRI system, the overall magnetic field produced by the system should be as homogeneous (i.e., uniform) as is possible. A conventional single-looped superconductive magnet coil circuit typically has multiple smaller-sized superconductive magnet coils that are spaced apart and electrically connected in series within the circuit instead of having only one or a few larger-sized magnet coils spaced apart and connected within the circuit. In this way, by strategically spacing the individual smaller magnet coils apart, a somewhat homogeneous magnetic field is generated whenever the magnet coils are energized with electric current. For improved field homogeneity, it has over the years become desirable to also establish one or more additional superconductive loop circuits of energized superconductive "secondary" coils proximate to the "primary" or "main" superconductive magnet coil circuit. In this way, by sizing the superconductive secondary coils and situating them proximate to the superconductive magnet coils of the main magnet coil circuit in a strategic fashion, the magnetic fields generated by the secondary coils interfere with and/or supplement the magnetic field generated by the main magnet coil circuit in a complementary fashion so as to help create an overall magnetic field ($B_O$) which is more homogeneous and desirable for imaging in a particular sized volume of space. This method of "field correction" by adding one or more loop circuits of energized secondary coils to help smooth out any inhomogeneities in the magnetic field created by the magnet coils of the main magnet coil circuit is called "shimming." For this reason, such secondary coils are commonly referred to as "shim coils," and a secondary loop circuit within which they are electrically connected is commonly referred to as a "shim coil circuit" or simply a "shim circuit." Although there are other different types of shim coils and shimming devices such as, for example, active resistive shim coils, gradient coils, and passive shim plates, superconductive shim coils are often highly desirable for their ability to shim magnetic fields for large spatial volumes.

In a conventional single-looped superconductive magnet coil circuit, when quenching of the electric current commonly flowing through the superconductive magnet coils of the circuit is initiated, the magnetic fields generated by the magnet coils then proceed to collapse. As these magnetic fields collapse, a tensive fluctuation in the level of current commonly flowing through the magnet coils is briefly induced. After such a brief tensive fluctuation, the level of current commonly flowing through the magnet coils then quickly settles down to zero, thereby concluding the quench event. As acknowledged in Lenz's law, such an induced fluctuation in the current level is due to the magnet coil circuit's attempt to conserve flux in response to the collapse of the magnetic fields in the magnet coils. In addition to the superconductive magnet coil circuit itself, if the superconductive shim coils of a single-looped superconductive shim coil circuit are situated sufficiently close to the superconductive magnet coils of the magnet coil circuit during the magnetic fields' collapse, a tensive fluctuation in the level of electric current flowing through the shim coils may be briefly induced as well. Briefly inducing a tensive current fluctuation in proximately situated shim coils in this manner is due to "inductive coupling" resulting from the electromagnetic phenomenon known as "mutual induction." In general, the level or strength of mutual induction between any two proximately situated coils is largely dependent on (1) the relative distance between the two coils, (2) the respective physical dimensions of the two coils, and (3) the permeabilities of the two coils' respective cores. If such a tensive current fluctuation induced in the superconductive shim coils is large enough to cause the current in the superconductive shim coil circuit to reach a "critical level" at which quenching and the consequential uncontrolled release of large amounts of thermal energy is initiated, one or more highly localized hot spots may be created in the shim coil circuit. As a result, the shim coil circuit may inadvertently be permanently damaged.

To prevent a proximately situated superconductive shim coil circuit from being damaged during a quench event in a conventional single-looped superconductive magnet coil circuit, both the physicalities of the shim coils and the spacings of the shim coils relative to the magnet coils are typically optimized and adjusted to simply reduce inductive coupling between the magnet coils and the shim coils. Such optimization and adjustment is generally not overly difficult, for when the magnet coil circuit is conventionally configured as a single-looped circuit, the level of electric current flowing through the serially connected magnet coils in the circuit is the same and common to all magnet coils therein. Thus, when quenching occurs in a conventional single-looped superconductive magnet coil circuit, the electric current in the circuit initially fluctuates and thereafter ultimately settles down to zero in a uniform manner through all of the magnet coils serially connected in the circuit. Given such commonality and uniformity of current flow through the magnet coils of a conventional single-loop superconductive magnet coil circuit, design of a complementary superconductive shim coil circuit that will not be strongly coupled to the magnet coil circuit during quenching is rather straightforward, for the magnet coil circuit generally need only be singly addressed as a whole for shim circuit design purposes. Ultimately, therefore, by anticipating the circuit behavior and uniformly fluctuating electric current level of a given magnet coil circuit during a quench event via computer simulation, an appropriate shim coil circuit for functionally complementing the magnet coil circuit can be designed so as to minimize inductive coupling during any such quench event. In this way, any electric current induced in the shim coil circuit during a quench event in the magnet coil circuit is largely limited and prevented from reaching a level that might cause permanent damage to the shim coil circuit.

With, however, the above-described recent advent of a multi-section protected superconductive magnet coil circuit wherein magnet coils are situated and protected within multiple looped sections of the circuit, addressing a magnet coil circuit as a whole for shim circuit design purposes is generally no longer practical or appropriate. In particular, given the parallel circuitry of various resistive elements and diodes which uniquely define the multiple protected sections within such a magnet coil circuit, the levels of electric current respectively flowing through the individual magnet coils at a given point in time are not always the same during a quench event in the magnet coil circuit. That is, depending on the particular section(s) of the magnet coil circuit in which the quench event is initiated and the unique chain reaction design scheme hardwired therein for triggering both the shunting of current away from certain magnet coils and the inducing of quenching in certain other magnet coils to more evenly distribute the release of thermal energy from the circuit, the levels of current respectively flowing through the magnet coils connected within the various sections of the magnet coil circuit are likely to be different and non-uniform. Hence, by design, different current fluctuation levels, fluctuation times, and rates of ultimate current collapse within the various protected sections of the magnet coil circuit are likely to be realized during a given quench event. Thus, for any such given multi-section protected superconductive magnet coil circuit, it is generally no longer appropriate to simply address the magnet coil circuit as a whole for shim circuit design and damage protection purposes, for the behavior of such a magnet coil circuit is quite multi-faceted during a quench event. For this reason, a shim coil circuit intended to functionally complement such a magnet coil circuit should ideally be designed to address the multi-faceted and section-specific behaviors of the various protected sections within the magnet coil circuit. In this way, one or more sections of the magnet coil circuit do not unexpectedly induce an excessively high and potentially damaging level of current in the shim coil circuit.

In light of the above, there is a present need in the relevant art for a shim coil circuit or system that (1) successfully shims a magnetic field generated by a multi-section protected superconductive magnet coil circuit in an MRI system and also (2) successfully avoids damage caused by mutual induction during a quench event in a multi-section protected superconductive magnet coil circuit of an MRI system.

In addition to the above, there is also a present need in the relevant art for an external interference shield (EIS) coil circuit or system that (1) successfully shields a magnetic field generated by a multi-section protected superconductive magnet coil circuit in an MRI system from external disturbances and also (2) successfully avoids damage caused by mutual induction during a quench event in a multi-section protected superconductive magnet coil circuit of an MRI system.

In further addition to the above, there is also a present need in the relevant art for other somewhat analogous secondary coil circuits or systems that successfully avoid damage caused by mutual induction during quench events in the multi-section protected superconductive magnet coil circuits of, for example, nuclear magnetic resonance (NMR) spectroscopy systems, mass spectrometer systems, and the like.

SUMMARY OF THE INVENTION

The present invention provides a secondary coil circuit for use with a multi-section protected superconductive magnet coil circuit in a system. In one practicable embodiment, the secondary coil circuit includes two circuit nodes, a ramping switch electrically connected between the two circuit nodes, and a number of secondary coils also electrically connected between the two circuit nodes. The secondary coils are made of wire having substantially superconductive capability when cooled below a characteristic critical temperature level and conducting electric current below a characteristic critical current level. Composed of such wire, the secondary coils are sized and positioned relative to the superconductive magnet coils situated in the individual sections of the multi-section protected superconductive magnet coil circuit so as to functionally cooperate with the multi-section protected superconductive magnet coil circuit in producing and maintaining a magnetic field that is substantially homogeneous.

In one preferred embodiment, the number, the physical characteristics, and the positions of the secondary coils are all selected to cooperatively minimize mutual induction between each of the individual sections of the multi-section protected superconductive magnet coil circuit and the secondary coil circuit during a quench event in the multi-section protected superconductive magnet coil circuit. In this way, electric current in the secondary coil circuit is prevented from being induced to rise to a predetermined unstable current level. In such an embodiment, the predetermined unstable current level may, for example, be substantially commensurate with the characteristic critical current level for the wire of the secondary coils.

In another preferred embodiment, the wire of the secondary coils is selected such that the characteristic critical current level for the wire is less than a predetermined unstable current level associated with the secondary coil circuit. In this way, if electric current in the secondary coil circuit is induced to rise during a quench event in the multi-section protected superconductive magnet coil circuit, the electric current is quenched before fully rising to the predetermined unstable current level.

In still another preferred embodiment, the secondary coil circuit further includes at least one quench-inducing resistive heater thermally coupled to at least one of the secondary coils and electrically connected in parallel with at least one of the superconductive magnet coils situated in the multi-section protected superconductive magnet coil circuit. Coupled and connected as such, each quench-inducing resistive heater is thereby positioned and designed for voltage-activation by the multi-section protected superconductive magnet coil circuit to preemptively initiate quenching in the secondary coil circuit. In this way, electric current in the secondary coil circuit is prevented from being induced to rise to a predetermined unstable current level during a quench event in the multi-section protected superconductive magnet coil circuit.

In addition to the secondary coil circuit itself, the present invention also provides a method of installing a secondary coil circuit for use with a multi-section protected superconductive magnet coil circuit in a system. In one practicable methodology, the method includes the steps of (a) electrically connecting a ramping switch between two circuit nodes, and (b) obtaining secondary coils comprising wire having substantially superconductive capability when cooled below a characteristic critical temperature level and conducting electric current below a characteristic critical current level. In addition, the method also includes the steps of (c) electrically connecting a number of the secondary coils between the two circuit nodes, and (d) sizing and positioning the secondary coils relative to the superconductive magnet coils situated in the individual sections of the multi-section protected superconductive magnet coil circuit so that the secondary coils functionally cooperate with the multi-section protected superconductive magnet coil circuit in producing and maintaining a magnetic field that is substantially homogeneous.

In each such practicable embodiment and methodology of the present invention, the involved system may be, for example, a nuclear magnetic resonance (NMR) spectroscopy system, a mass spectrometer system, a magnetic resonance imaging (MRI) system, or the like. The secondary coils themselves may be, for example, shim coils, external interference shield (EIS) coils, or the like.

Furthermore, it is believed that various other embodiments, methodologies, design considerations, applications, and advantages of the present invention will become apparent to those skilled in the art when the detailed description of the best mode(s) contemplated for practicing the invention, as set forth hereinbelow, is reviewed in conjunction with the appended claims and the accompanying drawing figures.

BRIEF DESCRIPTION OF THE DRAWINGS

The present invention is described hereinbelow, by way of example, with reference to the following drawing figures.

FIG. 8 is a table setting forth physical dimensions and characteristics of the originally proposed set of superconductive $Z^2$ shim coils incorporated in the superconductive shim coil circuit of FIG. 7.

FIG. 9 is a table setting forth performance results of the superconductive shim coil circuit depicted in FIG. 7 that incorporates the originally proposed set of superconductive $Z^2$ shim coils characterized in FIG. 8.

FIG. 13 is a table setting forth physical dimensions and characteristics of the modified set of superconductive $Z^2$ shim coils incorporated in the superconductive shim coil circuit of FIG. 12.

FIG. 14 is a table setting forth performance results of the superconductive shim coil circuit depicted in FIG. 12 that incorporates the modified set of superconductive $Z^2$ shim coils characterized in FIG. 13.

DETAILED DESCRIPTION OF THE INVENTION

Figure 1:
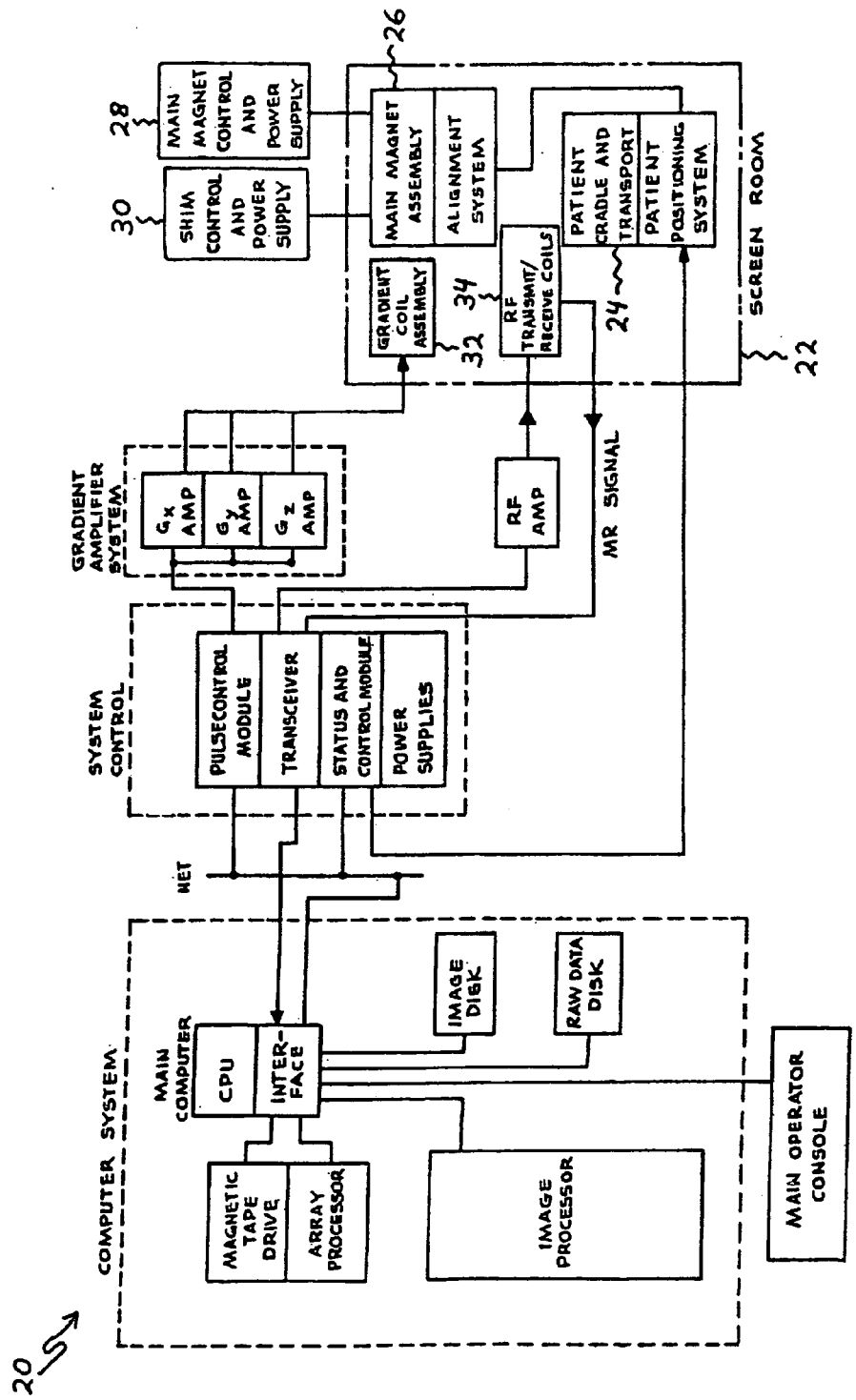
FIG. 1 is a block diagram of a magnetic resonance imaging system.

As an example, FIG. 1 shows a block diagram of a magnetic resonance imaging (MRI) system 20. Prior to operating the system 20, a patient is generally ushered into a shielded screen room 22. Once in the screen room 22, the patient is then situated in a supine position upon an electromechanical cradle-and-transport apparatus 24. After the patient is properly situated, the cradle-and-transport apparatus 24 is activated so as to move and thereby introduce the patient into an imaging bore defined within a main magnet assembly 26. Once in the main magnet assembly 26, the position of the patient is carefully aligned so as to focus in on an anatomic region of interest (ROI) within the patient's body. After being aligned, the patient is left immobilized within the main magnet assembly 26 in preparation for the system 20 to scan the patient.

When the MRI system 20 commences a scan operation, the designated region of interest (ROI) within the patient's body is immersed in a magnetic field $B_0$. In this way, atoms that both are within the ROI and have a nuclear spin dipole moment responsively orient themselves either parallel or anti- parallel to the magnetic field $B_0$ to facilitate imaging. The magnetic field $B_0$ itself is generated by the main magnet assembly 26 with the help of a main magnet control and power supply (CAPS) 28. With additional help from a shim control and power supply (CAPS) 30, the magnetic field $B_0$ generated by the main magnet assembly 26 is "corrected" so as to make the magnetic field $B_0$ substantially homogeneous (i.e., uniform). Working in cooperation with the main magnet assembly 26, an assembly of activatable gradient coils 32 serves to vary the strength of the magnetic field $B_0$. Also working in cooperation with the main magnet assembly 26, one or more RF transmit/receive coils 34 serve to electromagnetically excite biological tissue within the ROI and also detect response signals from the excited tissue. By processing the response signals, the MRI system 20 ultimately generates one or more images of the excited tissue within the ROI for examination and diagnosis purposes.

Figure 2:
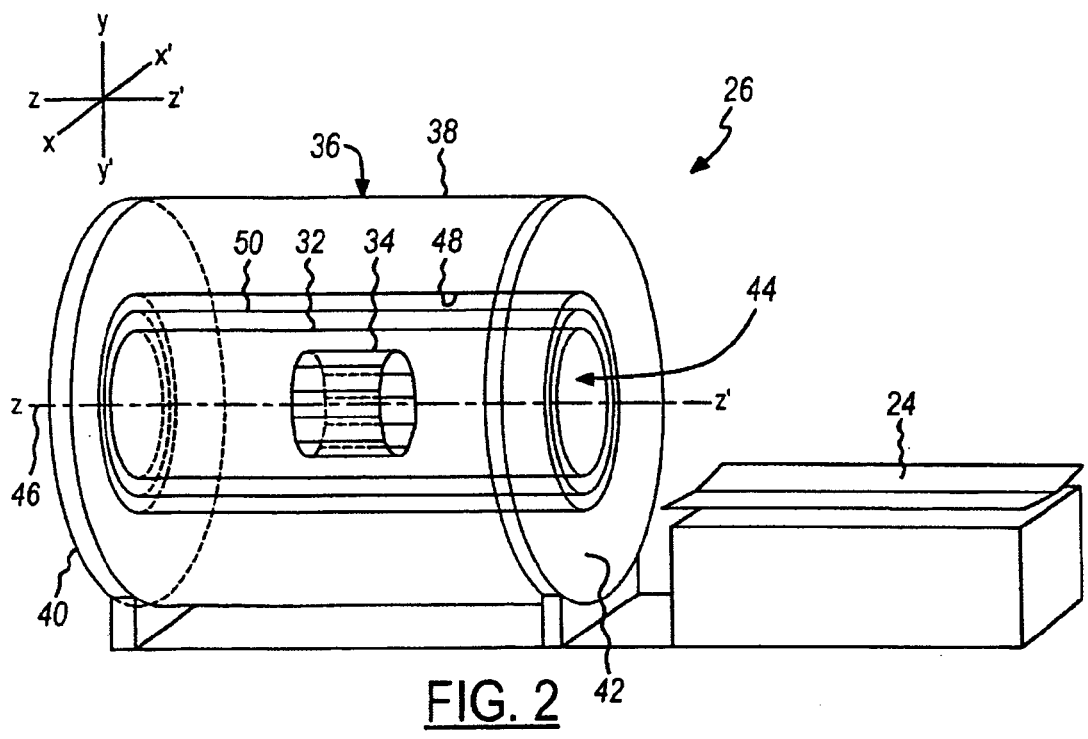
FIG. 2 is an illustration of a main magnet assembly and a patient cradle-and-transport apparatus situated within a screen room of the magnetic resonance imaging system depicted in FIG. 1. In the illustration, the main magnet assembly is situated and enclosed within a cryostat.

FIG. 2 is an illustration of the main magnet assembly 26 and the patient cradle-and-transport apparatus 24 situated within the screen room 22 of the MRI system 20 depicted in FIG. 1. In the illustration, the main magnet assembly 26 is largely situated, supported, and enclosed within a drum-shaped cryogen vessel or cryostat 36. The cryostat 36 itself has a cylindrical outer surface 38, a cylindrical inner surface 48, and two annular end surfaces 40 and 42. With the cryostat 36 constructed as such, its cylindrical inner surface 48 defines a cylindrical imaging bore 44 within the center and along the length of the cryostat 36. With the imaging bore 44 defined as such, the drum-shaped cryostat 36 and the cylindrical imaging bore 44 are made concentric about a common Z–Z' axis 46. Given such a configuration, the cradle-and-transport apparatus 24 is able to situate a patient within the main magnet assembly 26 by simply introducing the patient into the imaging bore 44 along the Z–Z' axis 46.

As further illustrated in FIG. 2, a generally cylindrical assembly of active resistive shim coils 50 is mounted within the cylindrical imaging bore 44 and along the cylindrical inner surface 48 of the cryostat 36. When energized during a scan operation, such resistive shim coils 50 serve to generate numerous small magnetic fields that complement and/or help cancel out any inhomogeneities in the magnetic field $B_0$ generated by the main magnet assembly 26. In this way, the resistive shim coils 50 help to homogenize and make the magnetic field $B_0$ substantially uniform. Because such inhomogeneities or variations in the magnetic field $B_0$ may exist in numerous different functional forms (for example, linear, parabolic, et cetera), the assembly of active resistive shim coils 50 may include various sets of resistive shim coils that can generate opposing magnetic fields in different functional forms such as, for example, $Z^0$, $Z^1$, $Z^2$, $Z^3$, $Z^4$, $Z^5$, $X^1$, $X^3$, $X^1Z^1$, $X^1Z^2$, $X^1Z^3$, $Y^1$, $Y^3$, $Y^1Z^1$, $Y^1Z^2$, $Y^1Z^3$, $X^1Y^1$, $X^2Y^2$, $X^1Y^1Z^1$, $X^2Y^2Z^1$, et cetera. In general, each function-specific set of resistive shim coils is energized with a set-specific amount of electric current provided by the shim control and power supply 30. By introducing individually appropriate amounts of electric current into these various sets of resistive shim coils, the overall assembly of active resistive shim coils 50 helps to correct the magnetic field $B_0$ so as to ultimately make the overall field $B^0$ both substantially homogeneous and generally aligned with the Z–Z' axis 46. In embodiments other than the one particularly depicted in FIG. 2, however, the assembly of active resistive shim coils 50 may be omitted and replaced with other types of shim coils and/or shimming devices.

Just inside the generally cylindrical assembly of active resistive shim coils 50, a generally cylindrical assembly of activatable gradient coils 32 is mounted. When selectively energized during a scan operation, the gradient coils 32 introduce gradients (i.e., variations) within the magnetic field $B_0$ in pre-defined X, Y, and Z Cartesian coordinate directions. By introducing such gradients, the assembly of gradient coils 32 controllably varies the strength of the magnetic field $B_0$ in pre-defined X, Y, and Z Cartesian coordinate planes during a scan operation.

Within the generally cylindrical assembly of activatable gradient coils 32, an RF transmit/receive coil 34 is secured. During a scan operation, transmission circuitry in the RF coil 34 creates a magnetic field $B_1$, which is generally perpendicular to the magnetic field $B_0$, in order to electromagnetically excite biological tissue within the patient. In response, the excited tissue gives off an RF energy signal that is detected via receiving circuitry in the RF coil 34. In receiving the RF energy signal, electric currents (commonly called "MR signals") are thereby induced within the RF coil 34 and processed by "reconstruction" software in the MRI system 20 to generate one or more computer screen images of the tissue. Although other types of RF coils may indeed be utilized in the system 20, the RF coil 34 in the particular embodiment depicted in FIG. 2 is a "birdcage" type RF coil that is concentric with the Z–Z' axis 46.

Figure 3:
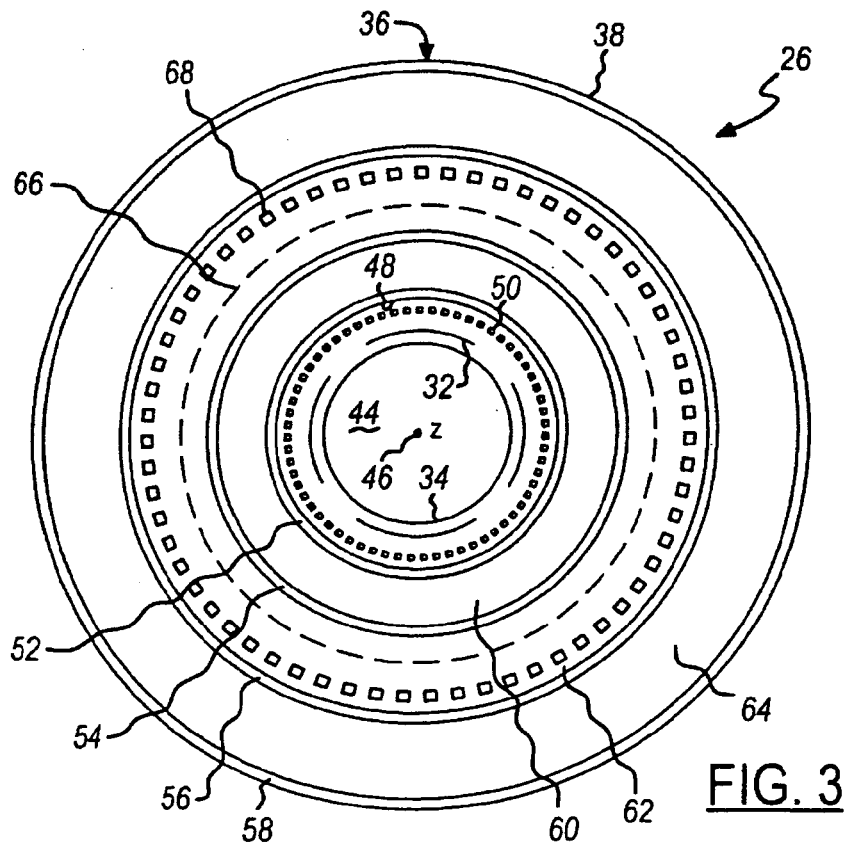
FIG. 3 is a cross-sectional illustration of the cryostat depicted in FIG. 2. In the illustration, relative positions of radio frequency (RF) coils, gradient coils, resistive shim coils, superconductive magnet coils, and superconductive shim coils enclosed within the cryostat are all highlighted.

FIG. 3 is a cross-sectional illustration of the cryostat 36 depicted in FIG. 2. As shown in FIG. 3, the main magnet assembly 26 within the cryostat 36 further includes a generally cylindrical assembly of superconductive magnet coils 66 as well as a generally cylindrical assembly of superconductive shim coils 68. During a scan operation, the assembly of superconductive magnet coils 66, when energized with electric current provided by the main magnet control and power supply 28, operates as the primary means for generating the magnetic field $B_0$ in the overall main magnet assembly 26. The assembly of superconductive shim coils 68, when energized with electric current provided by the shim control and power supply 30, works to further homogenize the magnetic field $B_0$ in cooperation with the assembly of active resistive shim coils 50. As particularly highlighted in FIG. 3, the RF transmit/receive coil 34 and the generally cylindrical assemblies of gradient coils 32, active resistive shim coils 50, superconductive magnet coils 66, and superconductive shim coils 68 are all generally situated in or about the cryostat 36 concentric with the Z–Z' axis 46.

In addition to helping support the overall main magnet assembly 26, the cryostat 36 also serves to house and enclose both the assembly of superconductive magnet coils 66 and the assembly of superconductive shim coils 68. In doing so, the cryostat 36 is able to keep both assemblies 66 and 68 in an operating environment wherein the temperature is maintained below their coils' respective critical temperatures ($T_{CRIT}$). In this way, during a scan operation, both the assembly of superconductive magnet coils 66 and the assembly of superconductive shim coils 68 characteristically behave in a superconductive manner by conducting energizing electric current with almost no resistance. To successfully maintain both the assembly of superconductive magnet coils 66 and the assembly of superconductive shim coils 68 below their respective critical temperatures, the cryostat 36 is compartmentalized into insulation zones 52, 54, 56, and 58 as well as refrigeration zones 60, 62, and 64. The insulation zones 52, 54, 56, and 58 have vacuums respectively established therein. The refrigeration zones 60, 62, and 64 are generally vessels wherein liquid cryogen baths are respectively contained. For example, the refrigeration zones 60 and 64 may both contain liquid nitrogen (L $N_2$), and the refrigeration zone 62 may contain liquid helium (L He). In the embodiment depicted in FIG. 3, the assembly of superconductive magnet coils 66 and the assembly of superconductive shim coils 68 are maintained below their coils' respective critical temperatures by being proximately situated within the liquid helium bath contained in the middle refrigeration zone 62. In other possible embodiments, the refrigeration zones 60 and 64, along with one or more of the insulation zones, may be altogether eliminated from the cryostat 36.

Figure 4:
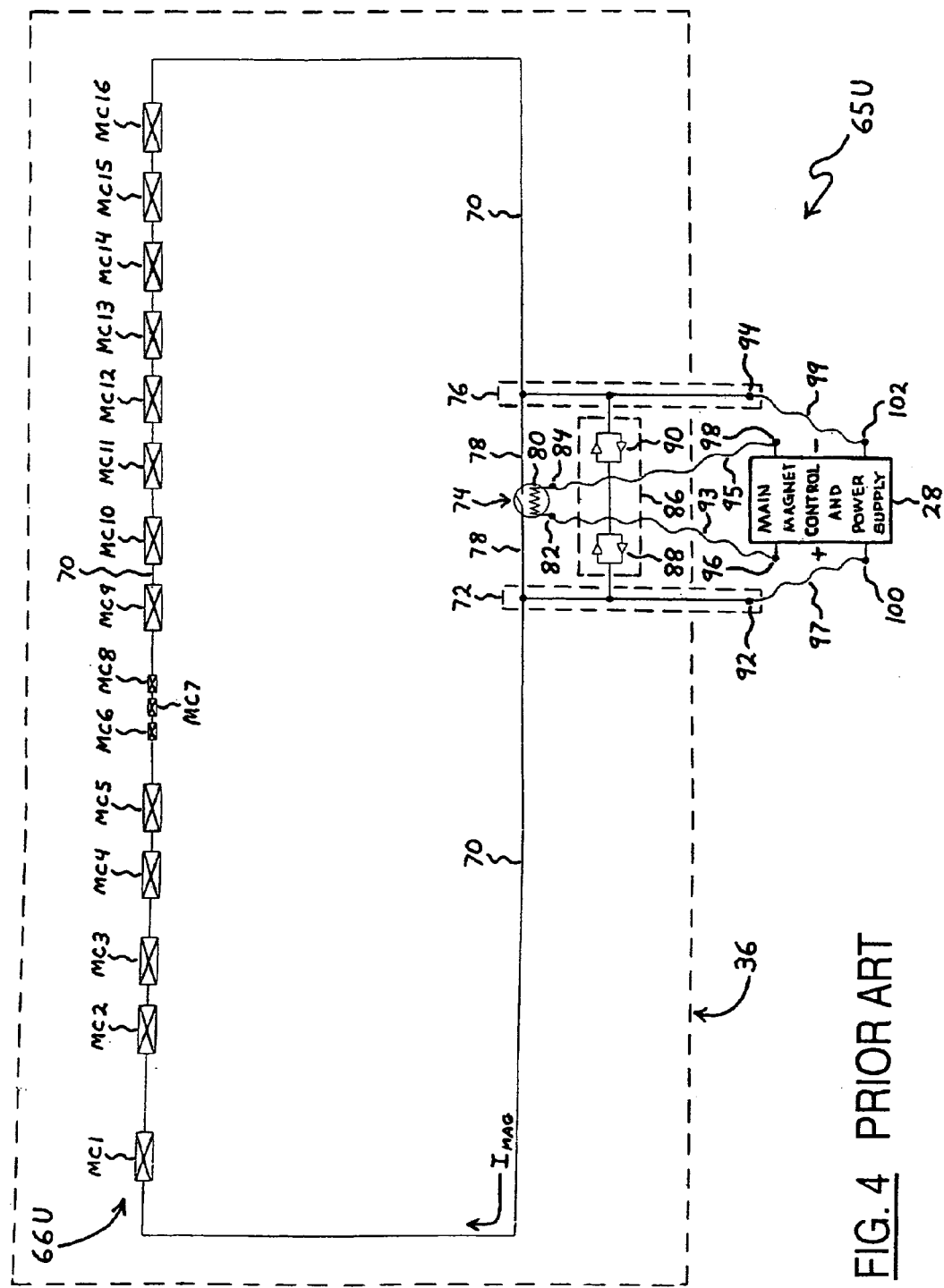
FIG. 4 is a circuit diagram of a conventional superconductive magnet coil circuit enclosed within the cryostat of FIG. 3. In the diagram, individual superconductive magnet coils (MCs) are electrically connected in an unprotected series within the superconductive magnet coil circuit.

FIG. 4 is a circuit diagram of a conventional superconductive magnet coil circuit 65U that is largely enclosed within the cryostat 36 of FIG. 3. In FIG. 4, the assembly of superconductive magnet coils 66 of FIG. 3 is shown to include individual superconductive magnet coils MC1, MC2, MC3, MC4, MC5, MC6, MC7, MC8, MC9, MC10, MC11, MC12, MC13, MC14, MC15, and MC16. Within the superconductive magnet coil circuit 65U, the superconductive magnet coils MC1 through MC16, according to convention, are electrically connected in a largely unprotected series between two circuit nodes 72 and 76 with one or more lengths of superconductive wire 70. In this embodiment, the two circuit nodes 72 and 76 generally serve as two power nodes. To help complete the superconductive magnet coil circuit 65U so as to form a closed loop, a ramping switch 74 is electrically connected between the two power nodes 72 and 76 with one or more lengths of superconductive wire 78.

According to convention, the ramping switch 74 is a superconductive switch. As such, the ramping switch 74 includes superconductive wire 78 and an activatable resistive heater 80. The superconductive wire 78 is electrically connected between the two power nodes 72 and 76. The activatable resistive heater 80, in turn, is electrically connected between two power connection terminals 82 and 84 and also situated proximate to the superconductive wire 78. In being situated proximate to the superconductive wire 78, the activatable resistive heater 80 is thereby thermally coupled to the superconductive wire 78. Coupled as such, the activatable resistive heater 80, when activated, operates to control the effective resistance of the superconductive wire 78.

In addition to the superconductive magnet coils MC1 through MC16 and the ramping switch 74, the superconductive magnet coil circuit 65U also includes a burnout protection circuit 86. As shown in FIG. 4, the burnout protection circuit 86 is electrically connected between the two power nodes 72 and 76 and in parallel with the ramping switch 74. In general, the burnout protection circuit 86 primarily serves to help prevent the ramping switch 74 and/or one or more of the superconductive magnet coils MC1 through MC16 from being inadvertently burned out and permanently damaged whenever the electric current $I_{MAG}$ circulating through the circuit 65U is dissipated by means of the ramping switch 74. In addition, however, the burnout protection circuit 86 also serves to help prevent the ramping switch 74 and/or one or more of the superconductive magnet coils MC1 through MC16 from being inadvertently burned out and permanently damaged should the electric current $I_{MAG}$ circulating through the circuit 65U ever be quenched by one or more unanticipated hot spots (i.e., localized thermal disturbances) that develop in the coils MC1 though MC16. In the embodiment depicted in FIG. 4, the burnout protection circuit 86 includes two reverse-connected diode pairs 88 and 90 electrically connected in series between the two power nodes 72 and 76. In other possible embodiments, the burnout protection circuit 86 may, for example, include energy-dissipating dump resistors in addition to, or instead of, such diode pairs 88 and 90.

To help complete the superconductive magnet coil circuit 65U, the main magnet control and power supply (CAPS) 28 of the MRI system 20 is, first of all, switchably connected between two power connection terminals 92 and 94 respectively associated with the two power nodes 72 and 76. Such a connection is actualized with two wires 97 and 99 that are respectively connected between the two power connection terminals 92 and 94 and two power supply terminals 100 and 102 associated with the main magnet CAPS 28. Similarly, the main magnet CAPS 28 is also switchably connected between the two power connection terminals 82 and 84 associated with the ramping switch 74. Such a connection is actualized with two wires 93 and 95 that are respectively connected between the two power connection terminals 82 and 84 and two power supply terminals 96 and 98 associated with the main magnet CAPS 28.

To introduce and ramp up the level of electric current $I_{MAG}$ in the conventional superconductive magnet coil circuit 65U for operating the MRI system 20, a controlled amount of electric current is first provided by the main magnet CAPS 28 via power supply terminals 96 and 98 and conducted through the activatable resistive heater 80 of the ramping switch 74. With the activatable resistive heater 80 being thermally coupled to the superconductive wire 78, a small section of the superconductive wire 78 is thereby heated above the characteristic critical temperature ($T_{CRIT}$) of the superconductive wire 78, thereby rendering the section of wire 78 temporarily resistive. After making a section of the wire 78 temporarily resistive in this manner, the main magnet CAPS 28, via power supply terminals 100 and 102, then introduces electric current into the superconductive magnet coil circuit 65U. With a section of the wire 78 rendered temporarily resistive, the electric current introduced into the circuit 65U is made to circulate through the wire 97, the power node 72, the superconductive magnet coils MC1 through MC16, the power node 76, and the wire 99, thereby largely bypassing the wire 78 along with the ramping switch 74. Furthermore, by introducing the electric current into the circuit 65U in a controlled manner, the flow and level of electric current $I_{MAG}$ passing through the superconductive magnet coils MC1 through MC16 may thereby be effectively increased. Once the electric current $I_{MAG}$ is ramped up to a desirable level, electric current provided by the main magnet CAPS 28 via power supply terminals 96 and 98 is switchably cut off so that electric current is no longer passed through the resistive heater 80 of the ramping switch 74. Upon turning off the resistive heater 80 in this manner, the small section of wire 78 is quickly cooled down by the cryogenic liquid contained in the middle refrigeration zone 62 of the cryostat 36 so that the wire 78 is again rendered altogether superconductive. As the wire 78 is returned to its superconductive state in this manner, the electric current introduced into the circuit 65U is then able to flow virtually effortlessly through the wire 78. At this point, the electric current being output via the power supply terminals 100 and 102 of the main magnet CAPS 28 may be slowly and gradually ramped down. In this way, the electric current introduced into the circuit 65U up until that point in time is ultimately left to circuitously flow in a virtually effortless and persistent manner both through the superconductive wire 78 of the ramping switch 74 and through the superconductive magnet coils MC1 through MC16. In establishing such a persistent flow of electric current $I_{MAG}$ in the superconductive magnet coil circuit 65U, the superconductive magnet coils MC1 through MC16 are able to cooperatively generate and establish the magnetic field $B_0$.

Sometimes, the MRI system 20 must intentionally be shut down for disassembly, relocation, upgrading, replenishing burned-off cryogens, performing general maintenance, et cetera. To shut down the system 20, the electric current $I_{MAG}$ persistently circulating through the superconductive magnet coil circuit 65U must generally be dissipated and thereby ramped down to zero. To ramp down the level of electric current $I_{MAG}$ in the circuit 65U, a controlled amount of electric current is provided by the main magnet CAPS 28 via power supply terminals 96 and 98 and conducted through the activatable resistive heater 80 of the ramping switch 74. With the activatable resistive heater 80 being thermally coupled to the superconductive wire 78, a small section of the superconductive wire 78 is thereby gradually heated above the characteristic critical temperature ($T_{CRIT}$) of the superconductive wire 78. In heating the superconductive wire 78 in this manner, the section of wire 78 is gradually made resistive. After heating and making a small section of the wire 78 resistive in this manner, the electric energy within the circuit 65U is then transferred to the main magnet CAPS 28, which is switchably connected in parallel with the small heated section, to thereby facilitate the shutdown. In addition thereto, electric energy within the circuit 65U is also dissipated via the external diode pairs 88 and 90, which are also connected in parallel with the small heated section.

In emergency situations, it may be necessary to intentionally shut down the MRI system 20 in a very short timeframe. To shut down the system 20, the electric current $I_{MAG}$ persistently circulating through the superconductive magnet coil circuit 65U must generally be dissipated and ramped down to zero. To ramp down the current $I_{MAG}$, the activatable resistive heater 80 of the ramping switch 74 is utilized to heat a section of the superconductive wire 78 in the circuit 65U above its characteristic critical temperature ($T_{CRIT}$) to thereby make the wire 78 resistive. As the resistive section of the wire 78 progressively "grows" and enlarges while being heated in this manner, the overall circuit 65U rapidly becomes extensively resistive as well. As a result, the electric energy within the circuit 65U is soon dissipated to zero. This process of heating and thereby making some portion of the circuit 65U resistive in order to quickly ramp down the current $I_{MAG}$ is, as alluded to hereinabove, commonly referred to as "quenching." During this process of quenching, the electric current $I_{MAG}$ must be carefully ramped down in a very controlled manner, for the electric and/or electromagnetic energy of the magnet coil circuit 65U is thereby converted into significant amounts of thermal energy (i.e., heat) which is released. Hence, if the electric current $I_{MAG}$ is ramped down and quenched too quickly or abruptly, large uncontrolled amounts of heat may suddenly be generated and emitted from the circuit 65U which could burn and permanently damage parts of the MRI system 20, including one or more sections of the circuit 65U itself and its magnet coils MC1 through MC16, or even other surrounding hardware. For this reason, precision control and care must be exercised when intentionally quenching the electric current $I_{MAG}$ in the superconductive magnet coil circuit 65U of the MRI system 20.

If, during a time when the electric current $I_{MAG}$ is being dissipated by means of the ramping switch 74, the voltage drop across the resistive section of wire 78 ever rises to a high enough level such that a diode from each of the two diode pairs 88 and 90 of the burnout protection circuit 86 becomes forward biased (i.e., "turned on"), some of the electric current $I_{MAG}$ will then be diverted through the burnout protection circuit 86 so as to bypass the resistive section of wire 78. Furthermore, if, during a time when the electric current $I_{MAG}$ is being dissipated by means of the ramping switch 74, the voltage drop across the resistive section of wire 78 ever rises to an even higher level that reverse biases a diode from each of the two diode pairs 88 and 90 of the burnout protection circuit 86, significantly more of the electric current $I_{MAG}$ will then be diverted through the burnout protection circuit 86 so as to bypass the resistive section of wire 78. In this way, therefore, with the burnout protection circuit 86 connected in parallel with the ramping switch 74, the burnout protection circuit 86 helps, when necessary, to temporarily "shoulder" electric current as the ramping switch 74 works to quench the electric current $I_{MAG}$. As a result, the ramping switch 74 is protected from inadvertent burnout and permanent damage.

Though the ramping switch 74 is individually well-protected from damage during current dissipation events in the conventional superconductive magnet coil circuit 65U, the individual superconductive magnet coils MC1 through MC16, in contrast, are generally not as well-protected from damage during certain quench events. In particular, whereas the burnout protection circuit 86 is connected in parallel with the ramping switch 74 to primarily protect the switch 74 when current dissipation is initiated by means of the switch 74, the burnout protection circuit 86 is generally not as effective in protecting the individual superconductive magnet coils MC1 through MC16 when quenching is initiated in one or more of the coils MC1 through MC16. That is, there generally is no sufficiently robust circuitry connected in parallel with any of the superconductive magnet coils MC1 through MC16 that adequately protects the coils MC1 through MC16, on an individual basis, from damage should quenching ever be initiated in one or more of the coils MC1 through MC16. Though dissipation of the electric current $I_{MAG}$ in the circuit 65U is, by design, intended to be initiated and largely carried out by means of the ramping switch 74, sometimes quenching of the electric current $I_{MAG}$ is initiated by an unanticipated thermal disturbance in one or more of the coils MC1 through MC16. Such an unanticipated thermal disturbance may be due to, for example, mechanical stress and the resultant frictional movement of one or more of the coils MC1 through MC16, the insufficient replenishment of burned-off liquid cryogens, et cetera. In other instances, such as during an emergency shutdown or "rundown," quenching of the electric current $I_{MAG}$ is intentionally initiated by directly heating one or more of the coils MC1 through MC16. In the event of any such thermal disturbances, whether unintentional or intentional, the consequential quenching initiated in one or more of the coils MC1 through MC16 may cause burnout and permanent damage to one or more of the coils MC1 through MC16 given their lack of robust parallel protection circuitry. For this reason, it is sometimes undesirable to incorporate a conventional superconductive magnet coil circuit, such as circuit 65U, with its unprotected superconductive magnet coils, into a modern MRI system such as system 20.

Figure 5:
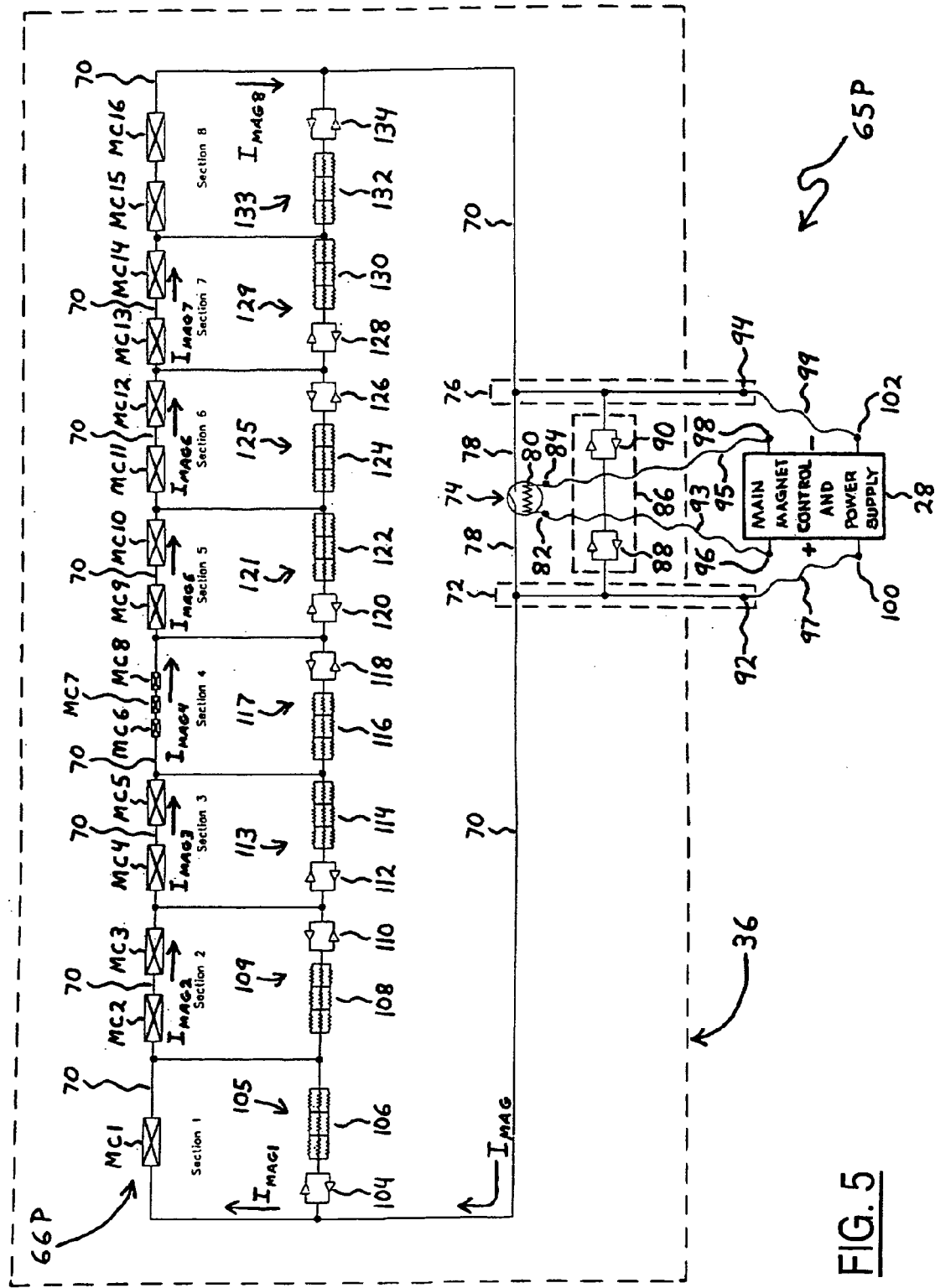
FIG. 5 is a circuit diagram of a modern multi-section protected superconductive magnet coil circuit alternatively enclosed within the cryostat of FIG. 3. In the diagram, individual superconductive magnet coils (MCs) are electrically connected in protected sections of the superconductive magnet coil circuit.

FIG. 5 is a circuit diagram of a modern superconductive magnet coil circuit 65P alternatively enclosed within the cryostat 36 of FIG. 3. A modern superconductive magnet coil circuit such as the circuit 65P in FIG. 5 is often more desirable than a conventional superconductive magnet coil circuit such as the circuit 65U in FIG. 4, for the individual superconductive magnet coils MC1 through MC16 in the modern circuit 65P are connected within multiple looped and protected sections 1 through 8 of the circuit 65P. Connected as such, each of the superconductive magnet coils MC1 through MC16 is individually well-protected from burnout and permanent damage in the event of uncontrolled quenching, including quenching that is initiated by an unanticipated thermal disturbance in one or more of the coils MC1 through MC16.

In each of the protected sections 1 through 8 within the superconductive magnet coil circuit 65P, one or more superconductive magnet coils (MCs) are electrically connected in parallel with section-specific protection circuitry. In particular, as shown in FIG. 5, the magnet coil MC1 is connected in parallel with protection circuitry 105 in protected section 1, the magnet coils MC2 and MC3 are connected in parallel with protection circuitry 109 in protected section 2, the magnet coils MC4 and MC5 are connected in parallel with protection circuitry 113 in protected section 3, the magnet coils MC6 through MC8 are connected in parallel with protection circuitry 117 in protected section 4, the magnet coils MC9 and MC10 are connected in parallel with protection circuitry 121 in protected section 5, the magnet coils MC11 and MC12 are connected in parallel with protection circuitry 125 in protected section 6, the magnet coils MC13 and MC14 are connected in parallel with protection circuitry 129 in protected section 7, and the magnet coils MC15 and MC16 are connected in parallel with protection circuitry 133 in protected section 8.

Furthermore, to help prevent undesirable current flow and time constants associated therewith that are caused by inductive coupling resulting from gradient and real-time shim operation, the protection circuitry in each of the protected sections 1 through 8 within the circuit 65P includes a reverse-connected diode pair electrically connected in series with a resistive network. In particular, as shown in FIG. 5, the protection circuitry 105 in protected section 1 includes a diode pair 104 connected in series with a resistive network 106, the protection circuitry 109 in protected section 2 includes a diode pair 110 connected in series with a resistive network 108, the protection circuitry 113 in protected section 3 includes a diode pair 112 connected in series with a resistive network 114, the protection circuitry 117 in protected section 4 includes a diode pair 118 connected in series with a resistive network 116, the protection circuitry 121 in protected section 5 includes a diode pair 120 connected in series with a resistive network 122, the protection circuitry 125 in protected section 6 includes a diode pair 126 connected in series with a resistive network 124, the protection circuitry 129 in protected section 7 includes a diode pair 128 connected in series with a resistive network 130, and the protection circuitry 133 in protected section 8 includes a diode pair 134 connected in series with a resistive network 132.

In general, each of the resistive networks 106, 108, 114, 116, 122, 124, 130, and 132 includes a unique section-specific combination of resistive circuit elements including, for example, one or more quench-inducing resistive heaters, energy-dissipating dump resistors, and/or conventional current-regulating resistors. Though not particularly shown in FIG. 5, each quench-inducing resistive heater, in addition to being electrically connected within a resistive network, is uniquely positioned physically proximate to or within at least one of the superconductive magnet coils MC1 through MC16. In this way, each quench-inducing resistive heater is thermally coupled to an assigned superconductive magnet coil (MC), which may or may not be connected within the same protected section of the circuit 65P as the resistive heater.

During usual operation, the modern superconductive magnet coil circuit 65P of FIG. 5 functions in a manner very similar to the above-described conventional superconductive magnet coil circuit 65U of FIG. 4. If, however, quenching is initiated by a thermal disturbance in one or more of the superconductive magnet coils MC1 through MC16, the circuit 65P of FIG. 5 then functions in a significantly different manner. In particular, with the protection circuitries 105, 109, 113, 117, 121, 125, 129, and 133 connected in parallel with the superconductive magnet coils MC1 through MC16 so as to define protected sections 1 through 8 in the circuit 65P, the magnet coils MC1 through MC16 are thereby better protected individually from heat damage resulting from such a thermal disturbance or uncontrolled quenching event.

For example, if the superconductive magnet coil MC1 is exposed to a significant thermal disturbance, the disturbance may counteract local cryogenic cooling and cause the temperature of a section of the magnet coil MC1 to begin rising. If the temperature rises above the coil's characteristic critical temperature ($T_{CRIT}$), the section of magnet coil MC1 becomes resistive and begins to dissipate (i.e., quench) the electric current $I_{MAG}$ (i.e., $I_{MAG1}$) circulating through the circuit 65P. Thereafter, if the thermal disturbance causes the coil section's resistance against the electric current $I_{MAG1}$ to further increase so as to create a voltage drop across the magnet coil MC1 that forward biases (i.e., "turns on") one diode from the diode pair 104 of the protection circuitry 105, some of the electric current $I_{MAG}$ (in particular, $I_{MAG}$ minus $I_{MAG1}$) will then be diverted through the protection circuitry 105 so as to bypass the coil MC1. Furthermore, if the thermal disturbance causes the coil section's resistance to even further increase so as to create an even larger voltage drop across the magnet coil MC1 that effectively reverse biases the other diode from the diode pair 104, significantly more of the electric current $I_{MAG}$ will then be diverted through the protection circuitry 105 so as to bypass the coil MC1. As the diode pair 104 permits some of the electric current $I_{MAG}$ to be diverted through the protection circuitry 105, the diverted current passes through the resistive network 106. As the diverted current passes through the resistive network 106, any dump resistor included in the network 106 then works to help dissipate some of the electric current $I_{MAG}$ (in particular, $I_{MAG}$ minus $I_{MAG1}$), and any conventional resistor included in the network 106 then works to help regulate the amount of current that is diverted through the protection circuitry 105. In addition thereto, any resistive heater included in the resistive network 106 then works to induce quenching in the superconductive magnet coil (MC) to which the resistive heater is both respectively assigned and thermally coupled. Though such a quench-inducing resistive heater is connected within the resistive network 106 of the protection circuitry 105 in protected section 1 of the circuit 65P, the resistive heater is preferably assigned and thermally coupled to a superconductive magnet coil (MC) that is connected within one of the other protected sections 2 through 8 of the circuit 65P. By taking a resistive heater connected in protected section 1 and thermally coupling the heater to a superconductive magnet coil (MC) connected within another protected section of the circuit 65P in this manner, any significant thermal disturbance and/or uncontrolled quenching originally initiated in the superconductive magnet coil MC1 thereby triggers quenching in the superconductive magnet coil connected within such other protected section of the circuit 65P. If this other protected section similarly includes a quench-inducing resistive heater connected within the resistive network of its protection circuitry, the quenching induced in the magnet coil (MC) of this other protected section is likely to trigger quenching in a superconductive magnet coil (MC) connected within still another protected section of the circuit 65P. In sum, therefore, any quenching initiated in one protected section of the circuit 65P will, by design, trigger a progressive and cascading chain reaction of quenching in numerous other sections of the circuit 65P as well. In this way, if significant or uncontrolled quenching begins in a superconductive magnet coil (MC) connected in one protected section of the circuit 65P, complete quenching of the electric current $I_{MAG}$ is ultimately effected via numerous sections of the circuit 65P so as to more evenly distribute the releasing and dumping of thermal energy from the circuit 65P. As a result, highly localized quenching in one superconductive magnet coil (MC), which could burnout and permanently damage the coil, is largely prevented. For this reason, incorporating the modern multi-section protected superconductive magnet coil circuit 65P of FIG. 5 within the MRI system 20 is generally more desirable than incorporating the more conventional superconductive magnet coil circuit 65U of FIG. 4.

Figure 6:
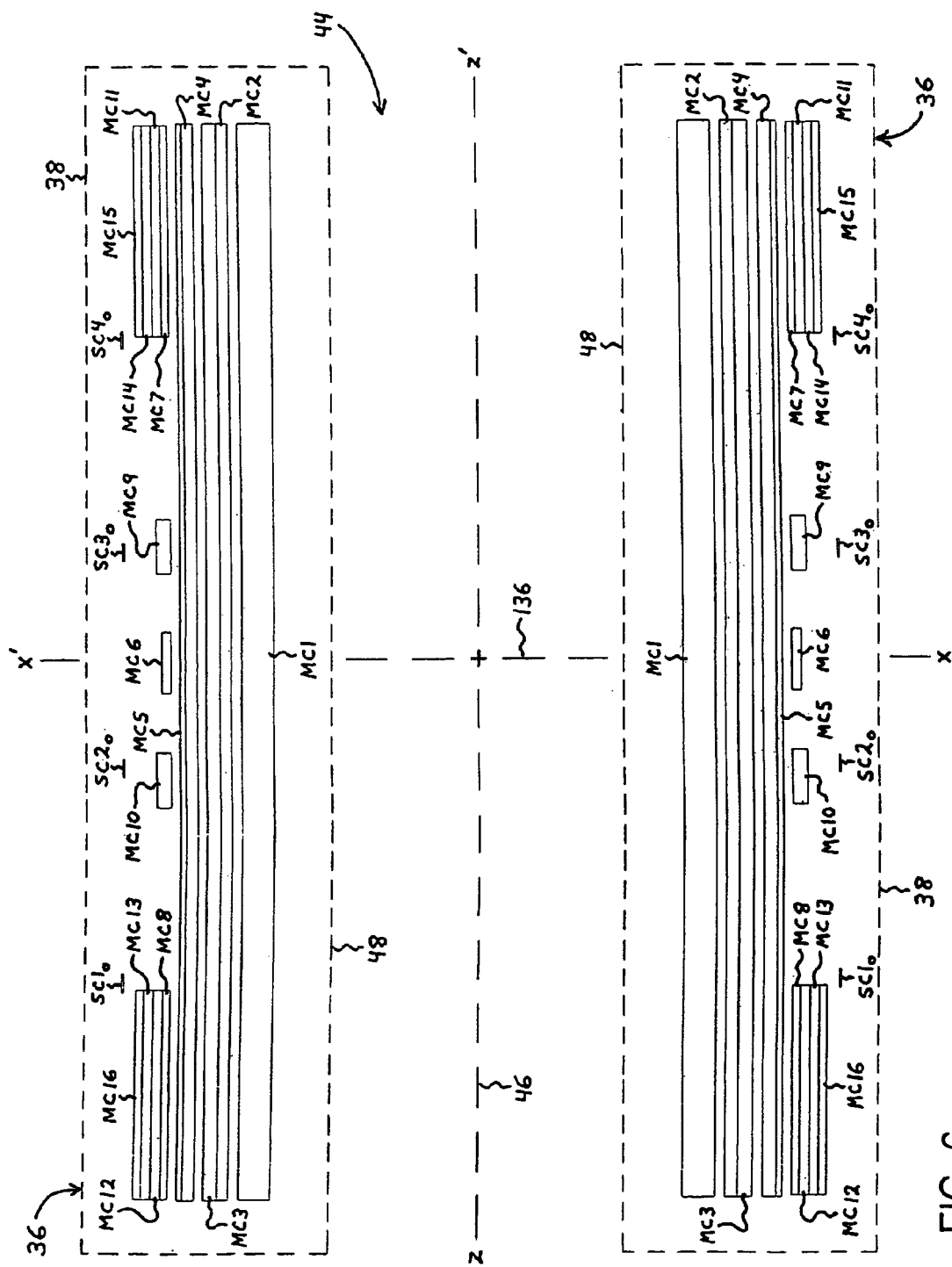
FIG. 6 is a cross-sectional diagram depicting both the superconductive magnet coils (MCs) of FIG. 5 and an originally proposed set of superconductive $Z^2$ shim coils (SCs) situated and enclosed within the cryostat of FIG. 3.
Figure 7:
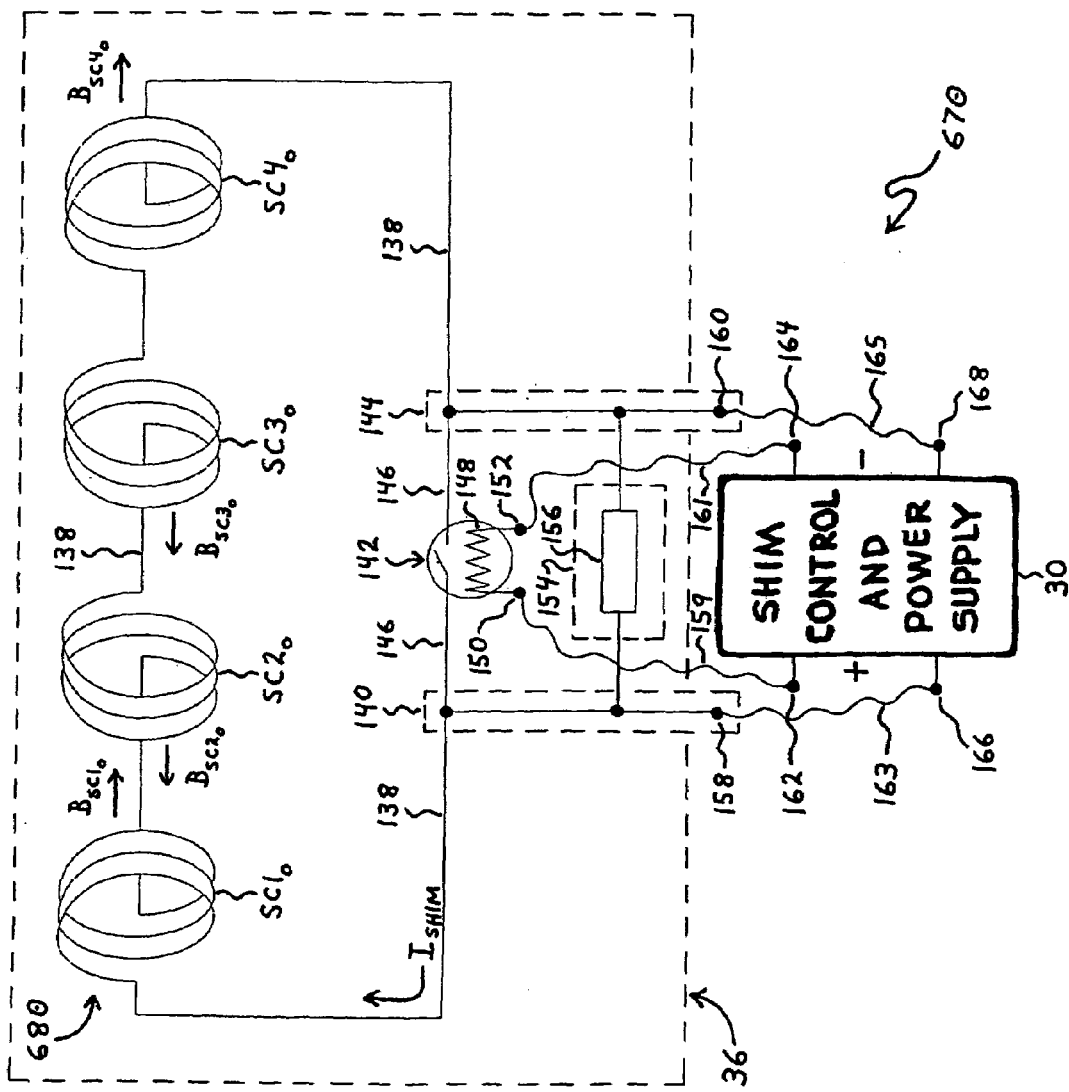
FIG. 7 is a circuit diagram of a superconductive shim coil circuit incorporating the originally proposed set of superconductive $Z^2$ shim coils (SCs) depicted in FIG. 6.

For scanning operations, whenever the electric current $I_{MAG}$ has been ramped up to a desirable level and is persistently circulating through the superconductive magnet coil circuit 65P in a proper manner, the magnetic field $B_0$ thereby generated by the superconductive magnet coils MC1 through MC16 is corrected (i.e., shimmed), at least in part, by the collective assembly of superconductive shim coils 68. The assembly 68 itself may include one or more different sets of superconductive shim coils. These different sets of superconductive shim coils are designed to generate correcting magnetic fields in various set-specific functional forms (for example, linear, parabolic, et cetera). In this way, the overall magnetic field $B_0$ is made more homogeneous to thereby facilitate accurate scanning and imaging on the MRI system 20. To this end, as an example, FIGS. 6 and 7 show part of an originally proposed assembly of superconductive shim coils 68O wherein an originally proposed set of superconductive $Z^2$ shim coils $SC1_O$, $SC2_O$, $SC3_O$, and $SC4_O$ is particularly highlighted. The superconductive $Z^2$ shim coils $SC1_O$ through $SC4_O$ themselves are preferably made of composite wire having both an inner filamentary core and an outer cladding layer. The inner filamentary core is made of superconductive material such as, for example, a niobium-titanium alloy. The outer cladding layer preferably comprises copper or an alloy thereof.

FIG. 6 is a general cross-sectional diagram depicting both the cylindrical assembly of superconductive magnet coils 66P (see FIG. 5) and part of the originally proposed cylindrical assembly of superconductive shim coils 68O (see FIG. 7) situated and enclosed within the cryostat 36 of FIG. 3. In the diagram of FIG. 6, the relative positions of the superconductive magnet coils MC1 through MC16 that make up the assembly 66P are particularly highlighted. In addition, the relative positions of the originally proposed set of superconductive $Z^2$ shim coils $SC1_O$ through $SC4_O$ that partially make up the assembly 68O are particularly highlighted as well. In general, both the superconductive magnet coils MC1 through MC16 and the superconductive $Z^2$ shim coils $SC1_O$ through $SC4_O$ are wound onto cylindrical structures, commonly called "formers" (not shown), that are fixedly situated within the cryostat 36. In this way, the superconductive magnet coils MC1 through MC16 and the superconductive $Z^2$ shim coils $SC1_O$ through $SC4_O$ are generally situated, by design, concentric with the Z–Z' axis 46. Furthermore, in the embodiment particularly shown in FIGS. 3 and 6, the superconductive $Z^2$ shim coils $SC1_O$ through $SC4_O$ are collectively positioned, by design, substantially circumjacent to (i.e., outside of) the superconductive magnet coils MC1 through MC16. In other possible embodiments, however, such superconductive shim coils may instead be collectively positioned within and/or alongside the superconductive magnet coils depending on system design and performance goals. Ultimately, the superconductive $Z^2$ shim coils $SC1_O$ through $SC4_O$ are both spaced and positioned relative to the superconductive magnet coils MC1 through MC16 in a strategic fashion so as to help shim and make the overall magnetic field $B_0$ generated by the main magnet assembly 26 more homogeneous. In this way, accurate scanning and imaging on the MRI system 20 is facilitated.

FIG. 7 is a circuit diagram of an originally proposed superconductive shim coil circuit 67O incorporating part of the originally proposed assembly of superconductive shim coils 68O. As shown in FIG. 7, the superconductive shim coil circuit 67O is largely enclosed within the cryostat 36 of FIG. 3 and includes the originally proposed individual superconductive $Z^2$ shim coils $SC1_O$, $SC2_O$, $SC3_O$, and $SC4_O$ of FIG. 6. Within the superconductive shim coil circuit 67O, the superconductive $Z^2$ shim coils $SC1_O$ through $SC4_O$ are electrically connected in a series between two power nodes 140 and 144 with one or more lengths of superconductive wire 138. To help complete the superconductive shim coil circuit 67O so as to form a closed loop, a ramping switch 142 is electrically connected between the two power nodes 140 and 144 with one or more lengths of superconductive wire 146.

In FIG. 7, the ramping switch 142 is a superconductive switch. As such, the ramping switch 142 includes superconductive wire 146 and an activatable resistive heater 148. The superconductive wire 146 is electrically connected between the two power nodes 140 and 144. The activatable resistive heater 148, in turn, is electrically connected between two power connection terminals 150 and 152 and also situated proximate to the superconductive wire 146. In being situated proximate to the superconductive wire 146, the activatable resistive heater 148 is thereby thermally coupled to the superconductive wire 146. Coupled as such, the activatable resistive heater 148, when activated, operates to control the effective resistance of the superconductive wire 146.

In addition to the superconductive $Z^2$ shim coils $SC1_O$ through $SC4_O$ and the ramping switch 142, the superconductive shim coil circuit 67O also includes a burnout protection circuit 154. As shown in FIG. 7, the burnout protection circuit 154 is electrically connected between the two power nodes 140 and 144 and in parallel with the ramping switch 142. In general, the burnout protection circuit 154 primarily serves to help prevent the ramping switch 142 and/or one or more of the superconductive $Z^2$ shim coils $SC1_O$ through $SC4_O$ from being inadvertently burned out and permanently damaged whenever the electric current $I_{SHIM}$ circulating through the circuit 67O is dissipated by means of the ramping switch 142. In addition, however, the burnout protection circuit 154 also serves to help prevent the ramping switch 142 and/or one or more of the superconductive $Z^2$ shim coils $SC1_O$ through $SC4_O$ from being inadvertently burned out and permanently damaged should the electric current $I_{SHIM}$ circulating through the circuit 67O ever be quenched by one or more unanticipated hot spots (i.e., localized thermal disturbances) that develop in the coils $SC1_O$ through $SC4_O$. In the embodiment depicted in FIG. 7, the burnout protection circuit 154 includes a resistor 156 electrically connected between the two power nodes 140 and 144. The resistor 156 itself is preferably an energy-dissipating dump resistor or some other current-shouldering type of resistor. In other possible embodiments, the burnout protection circuit 154 may, for example, include one or more diodes in addition to, or instead of, the resistor 156.

To help complete the superconductive shim coil circuit 67O, the shim control and power supply (CAPS) 30 of the MRI system 20 is, first of all, switchably connected between two power connection terminals 158 and 160 respectively associated with the two power nodes 140 and 144. Such a connection is actualized with two wires 163 and 165 that are respectively connected between the two power connection terminals 158 and 160 and two power supply terminals 166 and 168 associated with the shim CAPS 30. Similarly, the shim CAPS 30 is also switchably connected between the two power connection terminals 150 and 152 associated with the ramping switch 142. Such a connection is actualized with two wires 159 and 161 that are respectively connected between the two power connection terminals 150 and 152 and two power supply terminals 162 and 164 associated with the shim CAPS 30.

To introduce and ramp up the level of electric current $I_{SHIM}$ in the superconductive shim coil circuit 67O for operating the MRI system 20, a controlled amount of electric current is first provided by the shim CAPS 30 via power supply terminals 162 and 164 and conducted through the activatable resistive heater 148 of the ramping switch 142. With the activatable resistive heater 148 being thermally coupled to the superconductive wire 146, a small section of the superconductive wire 146 is thereby heated above the characteristic critical temperature ($T_{CRIT}$) of the superconductive wire 146, thereby rendering the section of wire 146 temporarily resistive. After making a section of the wire 146 temporarily resistive in this manner, the shim CAPS 30, via power supply terminals 166 and 168, then introduces electric current into the superconductive shim coil circuit 67O. With a section of the wire 146 rendered temporarily resistive, the electric current introduced into the circuit 67O is made to circulate through the wire 163, the power node 140, the superconductive $Z^2$ shim coils $SC1_O$ through $SC4_O$, the power node 144, and the wire 165, thereby largely bypassing the wire 146 along with the ramping switch 142. Furthermore, by introducing the electric current into the circuit 67O in a controlled manner, the flow and level of electric current $I_{SHIM}$ passing through the superconductive $Z^2$ shim coils $SC1_O$ through $SC4_O$ may thereby be effectively increased. Once the electric current $I_{SHIM}$ is ramped up to a desirable level, electric current provided by the shim CAPS 30 via power supply terminals 162 and 164 is switchably cut off so that electric current is no longer passed through the resistive heater 148 of the ramping switch 142. Upon turning off the resistive heater 148 in this manner, the small section of wire 146 is quickly cooled down by the cryogenic liquid contained in the middle refrigeration zone 62 of the cryostat 36 so that the wire 146 is again rendered altogether superconductive. As the wire 146 is returned to its superconductive state in this manner, the electric current introduced into the circuit 67O is then able to flow virtually effortlessly through the wire 146. At this point, the electric current being output via the power supply terminals 166 and 168 of the shim CAPS 30 may be slowly and gradually ramped down. In this way, the electric current introduced into the circuit 67O up until that point in time is ultimately left to circuitously flow in a virtually effortless and persistent manner both through the superconductive wire 146 of the ramping switch 142 and through the superconductive $Z^2$ shim coils $SC1_O$ through $SC4_O$. In establishing such a persistent flow of electric current $I_{SHIM}$ in the superconductive shim coil circuit 67O, the superconductive $Z^2$ shim coils $SC1_O$ through $SC4_O$ are able to respectively generate the magnetic fields $B_{SC1o}$, $B_{SC2o}$, $B_{SC3o}$, and $B_{SC4o}$, for thereby cooperatively correcting the overall magnetic field $B_0$.

As mentioned previously, the MRI system 20 must sometimes be intentionally shut down for disassembly, relocation, upgrading, replenishing burned-off cryogens, performing general maintenance, et cetera. To shut down the system 20, the electric current $I_{SHIM}$ persistently circulating through the superconductive shim coil circuit 67O must generally be dissipated and thereby ramped down to zero. To ramp down the level of electric current $I_{SHIM}$ in the circuit 67O, a controlled amount of electric current is provided by the shim CAPS 30 via power supply terminals 162 and 164 and conducted through the activatable resistive heater 148 of the ramping switch 142. With the activatable resistive heater 148 being thermally coupled to the superconductive wire 146, a small section of the superconductive wire 146 is thereby gradually heated above the characteristic critical temperature ($T_{CRIT}$) of the superconductive wire 146. In heating the superconductive wire 146 in this manner, the section of wire 146 is gradually made resistive. After heating and making a small section of the wire 146 resistive in this manner, the electric energy within the circuit 67O is then transferred to the shim CAPS 30, which is switchably connected in parallel with the small heated section, to thereby facilitate the shutdown. In addition thereto, electric energy within the circuit 67O is also dissipated via the resistor 156 of the burnout protection circuit 154, which is also connected in parallel with the small heated section.

During an intentional emergency shutdown of the MRI system 20, the electric current $I_{MAG}$ circulating through the superconductive magnet coil circuit 65P, as alluded to hereinabove, is generally dissipated and ramped down to zero in a very short timeframe (i.e., quenched). Dissipating the electric current $I_{MAG}$ in the circuit 65P in such a short timeframe may in some instances automatically trigger quenching of the electric current $I_{SHIM}$ in the superconductive shim coil circuit 67O, even without the aid of the ramping switch 142. Such automatic quenching of the electric current $I_{SHIM}$ is sometimes due to, for example, somewhat excessive inductive coupling between the superconductive magnet coil circuit 65P and the superconductive shim coil circuit 67O, certain mechanical stresses existing within the magnet coil circuit 65P and/or the shim coil circuit 67O, et cetera. In general, in any emergency shutdown situation wherein quenching of the electric current $I_{SHIM}$ is initiated either with or without the aid of the ramping switch 142, the electric current $I_{SHIM}$ must be dissipated in a sufficiently controlled manner, for the electric and/or electromagnetic energy of the shim coil circuit 67O is thereby converted into somewhat significant amounts of thermal energy (i.e., heat) which is released. Hence, if the electric current $I_{SHIM}$ is dissipated and quenched too quickly or abruptly, uncontrolled amounts of heat may suddenly be generated and emitted from the circuit 67O which could burn and permanently damage parts of the MRI system 20, including one or more sections of the circuit 67O itself and its shim coils $SC1_O$ through $SC4_O$, or even other surrounding hardware. For this reason, sufficient control and care must be exercised when quenching the electric current $I_{SHIM}$ in the superconductive shim coil circuit 67O of the MRI system 20.

In general, any time that the electric current $I_{SHIM}$ is being dissipated by means of a resistive (i.e., heated) section of wire 146 in the ramping switch 142, some of the electric current $I_{SHIM}$ is diverted through the resistor 156 of the burnout protection circuit 154 so as to bypass the resistive section of wire 146. In particular, as the section of wire 146 is progressively made more resistive through heating by the resistive heater 148, the amount of electric current $I_{SHIM}$ that is diverted through the resistor 156 correspondingly increases. In this way, the resistor 156 helps shoulder the electric current as the ramping switch 142 works to dissipate the electric current $I_{SHIM}$. In addition to merely helping shoulder the electric current, if the resistor 156 itself is particularly an energy-dissipating dump resistor, the resistor 156 then also participates with the ramping switch 142 in actively dissipating the electric current $I_{SHIM}$. In sum, therefore, by assisting the ramping switch 142 during current dissipation in one or more of these ways, the circuit 154 serves to protect the ramping switch 142 from inadvertent burnout and permanent damage.

FIG. 8 is a table setting forth physical dimensions and characteristics of the originally proposed set of superconductive $Z^2$ shim coils $SC1_O$ through $SC4_O$ incorporated in the originally proposed superconductive shim coil circuit 67O of FIG. 7. In the table of FIG. 8, the inner radius (A1) in centimeters (cm), the outer radius (A2) in centimeters (cm), the inner actual dimension (B1) in centimeters (cm), the outer actual dimension (B2) in centimeters (cm), the turn density (TD) (i.e., pitch) in number of turns per square centimeter (turns/cm²), the number of turns, the coil length (i.e., core length) in meters (m), and the number of layers of each of the originally proposed superconductive $Z^2$ shim coils $SC1_O$ through $SC4_O$ are all set forth in particular. In general, however, these various physical dimensions and characteristics of the originally proposed superconductive $Z^2$ shim coils $SC1_O$ through $SC4_O$ are all selected and/or determined via conventional methods so as ensure that the shim coils $SC1_O$ through $SC4_O$ are able to respectively generate magnetic fields $B_{SC1o}$ through $B_{SC4o}$ that will cooperatively help correct the magnetic field $B_0$ specifically generated by the assembly 66P of superconductive magnet coils MC1 through MC16. In this way, the set of superconductive $Z^2$ shim coils $SC1_O$ through $SC4_O$ is specifically designed and tailored so as to help make the overall, resultant magnetic field $B_0$ sufficiently homogeneous for high-quality scanning and imaging.

FIG. 9 is a table setting forth performance results of the originally proposed superconductive shim coil circuit 67O in FIG. 7 that incorporates the originally proposed set of superconductive $Z^2$ shim coils $SC1_O$ through $SC4_O$ characterized in FIG. 8. As indicated in the results tabulated in FIG. 9, the originally proposed superconductive $Z^2$ shim coils $SC1_O$ through $SC4_O$ are reasonably effective in helping shim the generated magnetic field $B_0$ so as to make the overall, resultant magnetic field $B_0$ sufficiently homogeneous for high-quality imaging. In particular, with the help of the originally proposed superconductive $Z^2$ shim coils $SC1_O$ through $SC4_O$, an overall homogeneity correction of −7.19 parts-per-million per ampere (ppm/A) over a spherical imaging volume (SV) having a 22.5-centimeter radius (i.e., a 45-centimeter diameter spherical imaging volume (DSV)) has been achieved.

As the results in FIG. 9 further indicate, however, a significant amount of inductive coupling between one or more of the individual protected sections 1 through 8 in the superconductive magnet coil circuit 65P and the superconductive shim coil circuit 67O incorporating the originally proposed superconductive $Z^2$ shim coils $SC1_O$ through $SC4_O$ may be realized during quenching of the electric current $I_{MAG}$ in the circuit 65P. In particular, when quenching of the electric current $I_{MAG}$ flowing through the superconductive magnet coil circuit 65P is initiated either unintentionally or intentionally, the magnetic fields respectively generated by the superconductive magnet coils MC1 through MC16 then proceed to collapse. As these magnetic fields collapse, various tensive fluctuations in the levels of electric currents $I_{MAG1}$ through $I_{MAG8}$ respectively flowing through the individual protected sections 1 through 8 of the magnet coil circuit 65P are briefly induced. After such brief fluctuations, the levels of electric currents $I_{MAG1}$ through $I_{MAG8}$ then quickly settle down to zero, thereby concluding the quenching of electric current $I_{MAG}$. As acknowledged in Lenz's law, these induced tensive fluctuations in the levels of electric currents $I_{MAG1}$ through $I_{MAG8}$ are due to the magnet coil circuit's attempting to conserve flux in response to the collapses of the magnetic fields in the individual protected sections 1 through 8 of the magnet coil circuit 65P. Given such, therefore, if the superconductive $Z^2$ shim coils $SC1_O$ through $SC4_O$ are situated sufficiently close to the superconductive magnet coils MC1 through MC16 during the magnet coils' respective magnetic field collapses, a tensive fluctuation in the level of electric current $I_{SHIM}$ commonly flowing through the shim coils $SC1_O$ through $SC4_O$ may be briefly induced as well. If such an induced tensive fluctuation is large enough to cause the electric current $I_{SHIM}$ flowing in the superconductive shim coil circuit 67O to reach a "critical current" ($I_{CRIT}$) level at which quenching and the consequential uncontrolled release of thermal energy is initiated, one or more highly localized hot spots may be created in the shim coil circuit 67O. As a result, the shim coil circuit 67O, as well as possibly other MRI hardware situated proximate thereto, may experience burnout and suffer permanent damage.

Figure 10:
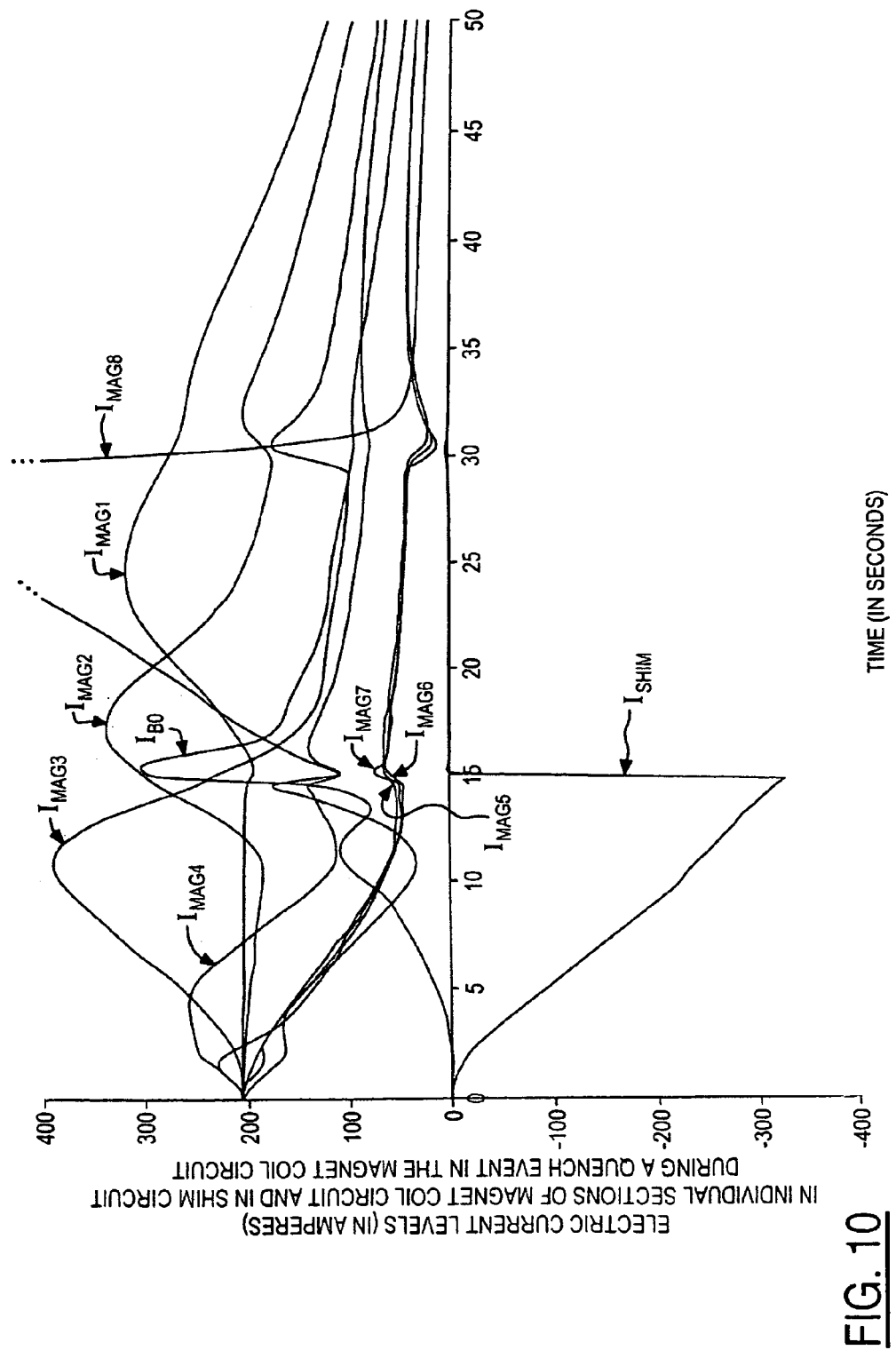
FIG. 10 is a graph illustrating resultant fluctuations in electric current levels both within individual sections of the multi-section protected superconductive magnet coil circuit of FIG. 5 and within the superconductive shim coil circuit of FIG. 7 during a quench event in the superconductive magnet coil circuit.

As an example, FIG. 10 graphically illustrates various tensive fluctuations in the levels of electric currents $I_{MAG1}$ through $I_{MAG8}$ respectively flowing through the individual protected sections 1 through 8 of the superconductive magnet coil circuit 65P during a quench event in the circuit 65P. In this particular example, the electric current $I_{MAG}$ in the superconductive magnet coil circuit 65P is being quenched from a current level of about 210 amperes (A) down to a current level of 0 A. As shown in the graph of FIG. 10, during the quenching of electric current $I_{MAG}$, one or more of the resultant tensive fluctuations in the levels of electric currents $I_{MAG1}$ through $I_{MAG8}$ flowing in superconductive magnet coil circuit 65P correspondingly induced a tensive fluctuation in the level of electric current $I_{SHIM}$ commonly flowing through the shim coils $SC1_O$ through $SC4_O$ of the superconductive shim coil circuit 67O. In this particular example, the tensive fluctuation induced in electric current $I_{SHIM}$ peaked at a current level of about 330 A (absolute value). Peaking at such a high magnitude in current level, however, is undesirable, for if such a current peak were to exceed the characteristic critical current ($I_{CRIT}$) inherently associated with the superconductive wire 138 in the superconductive shim coil circuit 67O (for example, if $I_{CRIT}$=300 A), quenching of the electric current $I_{SHIM}$ in the circuit 67O would be initiated. As a consequence of quenching the electric current $I_{SHIM}$ at such a high magnitude, large and uncontrolled amounts of thermal energy are likely to be released. As a direct result, the shim coil circuit 67O, as well as possibly other MRI hardware situated proximate thereto, is likely to experience burnout and suffer permanent damage.

As alluded to earlier hereinabove, briefly inducing a tensive fluctuation in the electric current $I_{SHIM}$ flowing through the superconductive shim coil circuit 67O as a consequence of quenching the electric current $I_{MAG}$ flowing through the superconductive magnet coil circuit 65P is due to "inductive coupling." Such inductive coupling is attributable to the electromagnetic phenomenon known as "mutual induction." Thus, in order to prevent the induction of such tensive current fluctuations in the superconductive shim coil circuit 67O to thereby ultimately prevent damage to the circuit 67O, any mutual induction between the superconductive magnet coil circuit 65P and the proximately situated superconductive shim coil circuit 67O must generally be reduced, minimized, or altogether prevented.

For a given superconductive magnet coil circuit at an MRI system installation site, it has heretofore been conventional practice to both design and install a complementary superconductive shim coil circuit based on the assumption that the electric current $I_{MAG}$ will briefly fluctuate and thereafter dwindle down to zero in a highly uniform fashion within each of the superconductive magnet coils during a quench event in the magnet coil circuit. In making such an assumption, computer modeling and simulation methods for predicting quench event behavior of the electric current $I_{MAG}$ in a given superconductive magnet coil circuit has traditionally been rather straightforward. As a result, shim designers heretofore have largely been able to easily determine optimal positioning and physical characteristics for the superconductive shim coils of a proposed shim coil circuit so as to minimize any possible inductive coupling to the magnet coil circuit during a quench event. In so attempting to ensure that a proposed superconductive shim coil circuit will always be largely decoupled from a superconductive magnet coil circuit during a quench event, shim designers have thereby ultimately sought to protect shim coil circuits from inadvertent burnout and permanent damage resulting therefrom.

Until recently, the simple assumption that the electric current $I_{MAG}$ flows and behaves uniformly in all of the superconductive magnet coils in a given superconductive magnet coil circuit has served shim designers well, for such an assumption is quite accurate when the magnet coil circuit happens to largely be a single-looped circuit as in, for example, the more conventional superconductive magnet coil circuit 65U of FIG. 4. In contrast, however, such a simple assumption is rather inaccurate for a more modern superconductive magnet coil circuit wherein the individual superconductive magnet coils are electrically protected within multiple circuit sections via parallel protection circuitry, as in the multi-section protected superconductive magnet coil circuit 65P of FIG. 5. The inaccuracy of such an assumption for such modern multi-section protected superconductive magnet coil circuits is best highlighted in FIG. 10 wherein the electric currents $I_{MAG1}$ through $I_{MAG8}$ respectively flowing through protected sections 1 through 8 of the superconductive magnet coil circuit 65P are demonstrably non-uniform during a quenching event. In light of such non-uniformity, one or more of the shim coils $SC1_O$ through $SC4_O$ within the superconductive shim coil circuit 67O may suddenly become inductively coupled to one or more of the magnet coils MC1 through MC16 within one or more of the various protected sections 1 through 8 of the superconductive magnet coil circuit 65P during any given quench event. Furthermore, given that the resistive networks of the protection circuitry in the protected sections 1 through 8 of the superconductive magnet coil circuit 65P have quench-inducing resistive heaters that are strategically thermally coupled to magnet coils in one or more other protected sections to create a cascading effect and thereby more evenly distribute and release thermal energy from the circuit 65P, the pattern of non-uniformity of the electric currents $I_{MAG1}$ through $I_{MAG8}$ in one quench event will not necessarily be similar to the pattern of non-uniformity in a different quench event. The reason for such is because each protected section 1 through 8 of the superconductive magnet coil circuit 65P has its own unique quench-inducing resistive heater scheme for triggering the even release of thermal energy from the overall circuit 65P should quenching be initiated in a magnet coil within that protected section. Thus, for example, if quenching is initiated in one of magnet coils MC2 or MC3 of protected section 2, the responsive quench-inducing resistive heater scheme for that protected section may indirectly cause a current fluctuation in electric current $I_{MAG7}$ that is greater than each of the current fluctuations caused in the other protected sections. On a different occasion, if quenching is initiated in one of magnet coils MC9 or MC10 of protected section 5, the responsive quench-inducing resistive heater scheme for that protected section may instead indirectly cause a current fluctuation in electric current $I_{MAG3}$ that is greater than each of the current fluctuations caused in the other protected sections. For this reason, therefore, a superconductive shim coil circuit pursuant to the present invention should be designed to accommodate a modern section-protected superconductive magnet coil circuit by properly addressing the individual electric currents respectively flowing through the magnet coils in the individual protected sections of the magnet coil circuit on an individual basis. In this way, an exceptionally high fluctuation in the level of electric current flowing through one or more magnet coils within a particular protected section of a given multi-section protected superconductive magnet coil circuit will not cause that section to be significantly inductively coupled to one or more shim coils in the superconductive shim coil circuit during a quench event in the magnet coil circuit. As a result, induction of a potentially damaging high level current fluctuation in the superconductive shim coil circuit is largely prevented.

To determine a general approach for designing a superconductive shim coil circuit that will remain largely decoupled from a given multi-section protected superconductive magnet coil circuit during a quench event, an equational analysis is desirable. In general, when an electric current $I_{SHIM}$ is persistently flowing through a closed-loop superconductive shim coil circuit during usual operation, the total voltage in the shim coil circuit during a sudden quench event in a multi-section protected superconductive magnet coil circuit situated proximate thereto can be expressed as follows in equation 1.

$$(V_{SHIM} \text{ total}) = (V_{SHIM} \text{ due to self-induction}) + (V_{SHIM} \text{ due to mutual induction to the magnet coil circuit}) \quad (1)$$

Since the superconductive shim coil circuit is a simple, closed-loop circuit while the electric current $I_{SHIM}$ is persistently flowing therein, Kirchoff's voltage law for closed-loop circuits teaches that the total $V_{SHIM} = 0$. Furthermore, since $$(V_{SHIM} \text{ due to self-induction}) = L_{SHIM} \frac{dI_{SHIM}}{dt} \text{ and}$$

$$(V_{SHIM} \text{ due to mutual induction to the magnet coil circuit}) = M_{SHIM\_TO\_MAG} \frac{dI_{MAG}}{dt}$$

according to classic electrical engineering principles, equation 1 can be alternatively expressed as follows in equation 2.

$$0 = L_{SHIM} \frac{dI_{SHIM}}{dt} + M_{SHIM\_TO\_MAG} \frac{dI_{MAG}}{dt} \quad (2)$$

Solving for $$\frac{dI_{SHIM}}{dt},$$

equation 2 can be alternatively expressed as follows in equation 3.

$$\frac{dI_{SHIM}}{dt} = \frac{-1}{L_{SHIM}} \left( M_{SHIM\_TO\_MAG} \frac{dI_{MAG}}{dt} \right) \quad (3)$$

If the multi-section protected superconductive magnet coil circuit has an m-number of protected sections (MAGs) including one or more magnet coils (MCs) within each section, then $$M_{SHIM\_TO\_MAG} \frac{dI_{MAG}}{dt}$$

can be expressed as follows in equation 4.

$$M_{SHIM\_TO\_MAG} \frac{dI_{MAG}}{dt} = M_{SHIM\_TO\_MAG1} \frac{dI_{MAG1}}{dt} + M_{SHIM\_TO\_MAG2} \frac{dI_{MAG2}}{dt} + M_{SHIM\_TO\_MAGm} \frac{dI_{MAGm}}{dt} \quad (4)$$

Ultimately, therefore, equation 2 can be alternatively expressed as follows in equation 5.

$$0 = L_{SHIM} \frac{dI_{SHIM}}{dt} + \left( M_{SHIM\_TO\_MAG1} \frac{dI_{MAG1}}{dt} + M_{SHIM\_TO\_MAG2} \frac{dI_{MAG2}}{dt} + \ldots + M_{SHIM\_TO\_MAGm} \frac{dI_{MAGm}}{dt} \right) \quad (5)$$

In addition, equation 3 can be alternatively expressed as follows in equation 6.

$$\frac{dI_{SHIM}}{dt} = \frac{-1}{L_{SHIM}} \left( M_{SHIM\_TO\_MAG1} \frac{dI_{MAG1}}{dt} + M_{SHIM\_TO\_MAG2} \frac{dI_{MAG2}}{dt} + \ldots + M_{SHIM\_TO\_MAGm} \frac{dI_{MAGm}}{dt} \right) \quad (6)$$

In the closed-loop superconductive shim coil circuit, the total $L_{SHIM}$ therein can be expressed as follows in equation 7.

$$(L_{SHIM} \text{ total}) = (L_{SHIM} \text{ due to self-induction of shim coils}) + (L_{SHIM} \text{ due to mutual induction between shim coils}) \quad (7)$$

According to classical electrical engineering principles, the $L_{SHIM}$ due to self-induction of an n-number of serially connected shim coils (SCs) can be expressed as follows in equation 8.

$$(L_{SHIM} \text{ due to self-induction of shim coils}) = L_{SC1} + L_{SC2} + \ldots + L_{SCn} \quad (8)$$

With $$\frac{dI_{SHIM}}{dt}$$

representing the change (i.e., fluctuation) in the level of electric current $I_{SHIM}$ flowing through the superconductive shim coil circuit during a quench event in the superconductive magnet coil circuit, it can be seen from equations 6 through 8 that the inductive response in the shim coil circuit can effectively be minimized by (1) increasing the self-inductance in the shim coil circuit, (2) reducing the amount of mutual inductance between the individual magnet coils in the individual protected sections of the magnet coil circuit and the individual shim coils in the shim coil circuit, or (3) both.

With regard to self-inductance, the self-inductance (L) of a given coil according to classic electrical engineering principles is largely defined as follows in equation 9.

$$L = \frac{\mu N^2 A}{l} \quad (9)$$

In equation 9, $\mu$ is the permeability constant of the material (i.e., core) about which the coil is wound, N is the number of complete turns in the coil wire, A is the cross-sectional area of the core, and 1 is the coil length (i.e., the mean length of the flux path defined end-to-end through the core). As indicated in equations 8 and 9, in a superconductive shim coil circuit wherein the shim coils are connected in series, the cumulative overall self-inductance of the shim coil circuit can be increased, for example, by increasing the number of turns in the coil wire within one or more of the shim coils and/or by adding additional shim coils within the shim coil circuit itself. As further indicated in equations 6 and 7, by increasing self-inductance within the superconductive shim coil circuit in this manner, the inductive response in the level of electric current $I_{SHIM}$ commonly flowing through the shim coils of the shim coil circuit is somewhat reduced during a quench event in a proximately situated multi-section protected superconductive magnet coil circuit.

With regard to mutual inductance, the level or strength of mutual induction between any two proximately situated coils is largely dependent on three factors. These three factors generally include (1) the relative distance between the two coils, (2) the respective physical dimensions of the two coils, and (3) the permeabilities ($\mu$) of the two coils' respective cores. Hence, by appropriately adjusting one or more of these three factors, the level or strength of mutual induction between any two proximately situated coils can be minimized. Given, however, that the respective cores of both the magnet coils in a multi-section protected superconductive magnet coil circuit and the shim coils in a superconductive shim coil circuit generally coincide with the open-air cylindrical imaging bore defined end-to-end through the center of the cryostat within a modern MRI system, reducing the level of mutual induction between a given multi-section protected superconductive magnet coil circuit and a proposed superconductive shim coil circuit is most feasibly accomplished by (1) adjusting the proposed positions of one or more of the shim coils relative to the given positions of the magnet coils and/or (2) adjusting the physical dimensions of one or more of the shim coils.

In short, therefore, the number, the physical characteristics, and the positions of the shim coils for a proposed superconductive shim coil circuit are preferably selected to cooperatively minimize mutual induction between each of the individual sections of a given multi-section protected superconductive magnet coil circuit and the shim coil circuit during a quench event in the magnet coil circuit. Most preferably, the number, the physical characteristics, and the positions of the shim coils are selected to cooperatively minimize mutual induction between each superconductive magnet coil situated in the individual sections of the multi-section protected superconductive magnet coil circuit and the shim coils of the shim coil circuit during a quench event in the magnet coil circuit. In this way, pursuant to the present invention, the sum of any inductive coupling between the magnet coil circuit and the shim coil circuit is, overall, largely minimized during a quench event in the magnet coil circuit. As a result, the electric current $I_{SHIM}$ in the superconductive shim coil circuit is thereby prevented from being induced to rise to a conventionally predetermined unstable current level that could burn out and permanently damage the shim coil circuit. In preventing such, however, the shim coils must also be physically designed and positioned so as to ensure that the overall magnetic field $B_0$ is substantially homogeneous as well.

In selecting a desirable set of shim coils to be included within a proposed superconductive shim coil circuit, some of the physical coil characteristics that should generally be considered for determination include, for example, coil length, coil inner radius, coil outer radius, coil axial location, coil wire length, coil wire diameter, coil wire material composition, number of coil turns, coil turn direction, coil turn density, et cetera. Ultimate determination of one or more of these physical characteristics may generally be made with the help of commercial, custom, and/or proprietary computer simulation software. In this way, the physical characteristics of the shim coils can be determined so as to help prevent the electric current $I_{SHIM}$ in the superconductive shim coil circuit from ever being induced to rise to a predetermined unstable current level during a quench event in a proximately situated multi-section protected superconductive magnet coil circuit. For example, if the conventionally predetermined unstable current level is substantially commensurate with the high-level characteristic critical current ($I_{CRIT}$) inherently associated with the particular type of superconductive wire making up the shim coils, selecting the physical characteristics of the shim coils so as to prevent the electric current $I_{SHIM}$ from ever being induced to rise to the predetermined unstable current level during a quench event in the magnet coil circuit thereby effectively prevents a heat-releasing quench event from ever inadvertently occurring in the shim coil circuit during such a quench event in the magnet coil circuit. In this way, the superconductive shim coil circuit is protected from high-voltage burnout and possible permanent damage resulting from the uncontrolled release of a large amount of thermal energy from the shim coil circuit.

Figure 11:
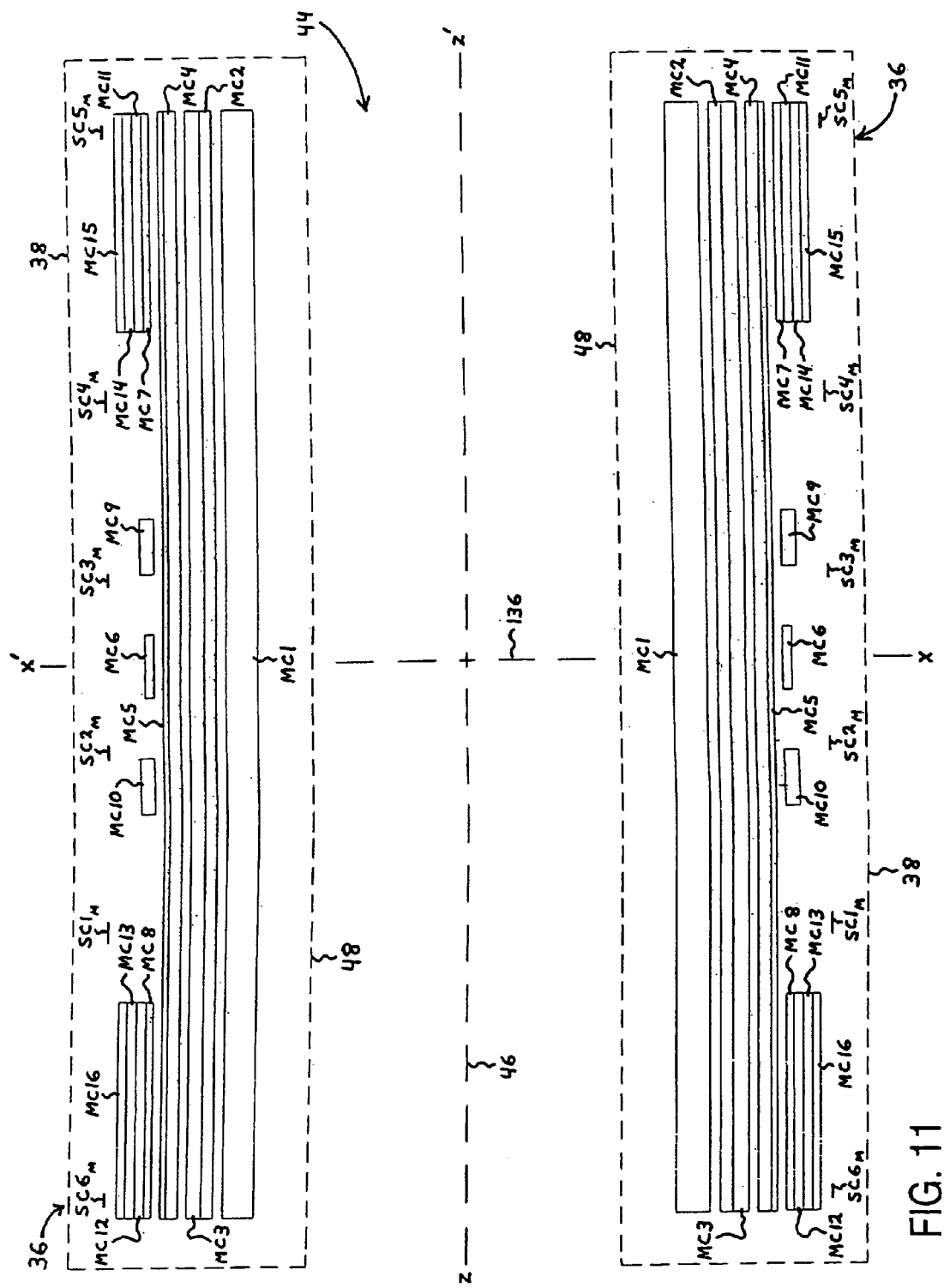
FIG. 11 is a cross-sectional diagram depicting both the superconductive magnet coils (MCs) of FIG. 5 and a modified set of superconductive $Z^2$ shim coils (SCs) situated and enclosed within the cryostat of FIG. 3.

FIG. 11 is a general cross-sectional diagram depicting both the cylindrical assembly of superconductive magnet coils 66P (see FIG. 5) and part of a modified cylindrical assembly of superconductive shim coils 68M (see FIG. 12) situated and enclosed within the cryostat 36 of FIG. 3. In general, the assembly of superconductive shim coils 68M has been modified pursuant to the present invention so as to reduce mutual induction between the superconductive magnet coils MC1 through MC16 of the multi-section protected superconductive shim coil circuit 65P and the modified superconductive $Z^2$ shim coils $SC1_M$ through $SC6_M$ included in the modified assembly of shim coils 68M. In the diagram of FIG. 11, the relative positions of the superconductive magnet coils MC1 through MC16 that make up the assembly 66P are particularly highlighted. In addition, the relative positions of the modified set of superconductive $Z^2$ shim coils $SC1_M$ through $SC6_M$ that partially make up the modified assembly 68M are particularly highlighted as well. As compared to the originally proposed set of superconductive $Z^2$ shim coils $SC1_O$ through $SC4_O$ shown in FIGS. 6 and 7, the modified set of superconductive $Z^2$ shim coils $SC1_M$ through $SC6_M$ in FIG. 11, in addition to having shim coils situated in different relative positions, includes two additional shim coils. Situated as such and comprising such, the modified superconductive $Z^2$ shim coils $SC1_M$ through $SC6_M$ are thereby both spaced and positioned relative to the superconductive magnet coils MC1 through MC16 in a strategic fashion so as to help reduce inductive coupling therebetween and also make the overall magnetic field $B_0$ more homogeneous.

Figure 12:
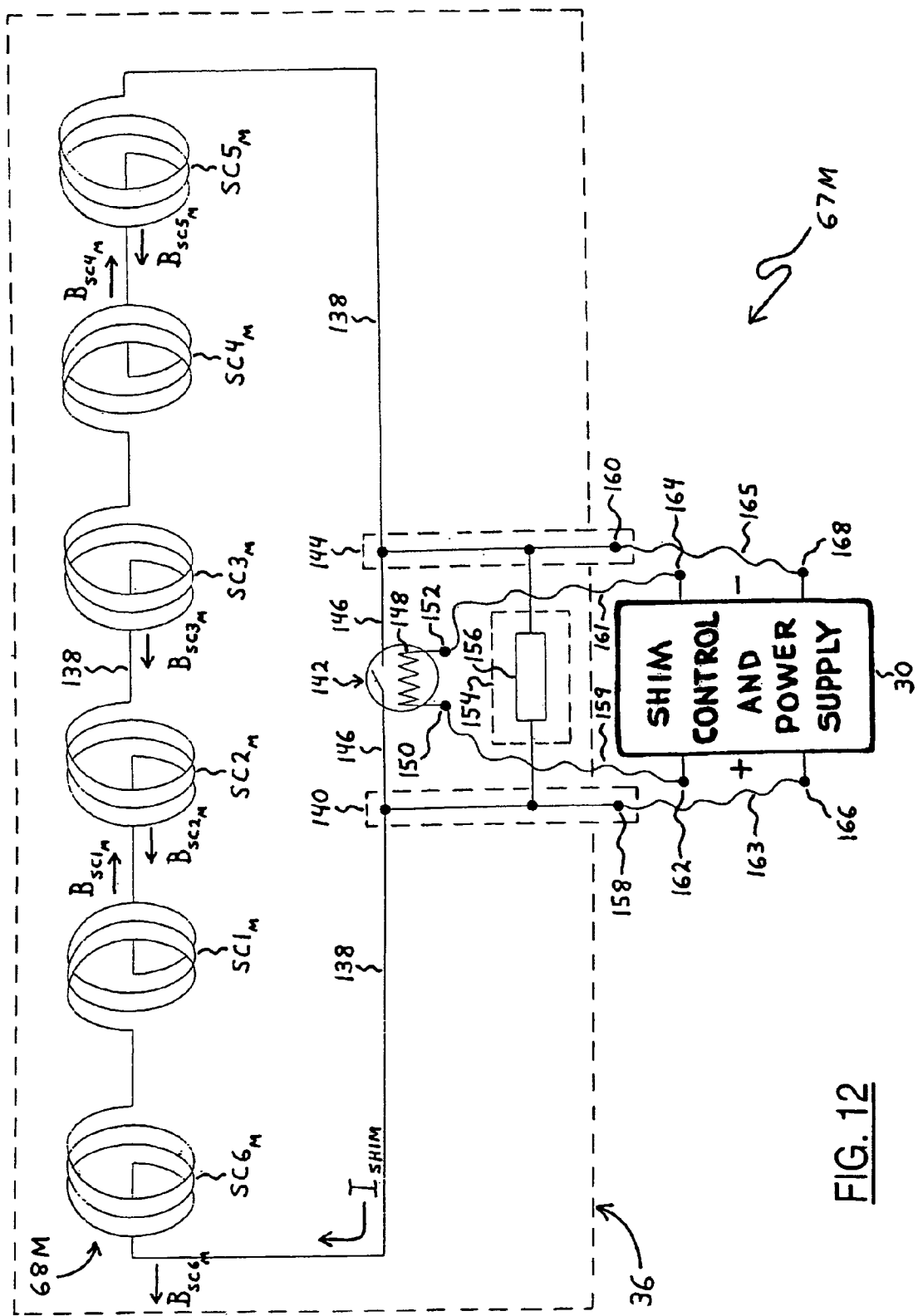
FIG. 12 is a circuit diagram of a superconductive shim coil circuit incorporating the modified set of superconductive $Z^2$ shim coils (SCs) depicted in FIG. 11.

FIG. 12 is a circuit diagram of a modified superconductive shim coil circuit 67M incorporating part of the modified assembly of superconductive shim coils 68M. As shown in FIG. 12, the modified superconductive shim coil circuit 67M is largely enclosed within the cryostat 36 of FIG. 3 and includes the modified individual superconductive $Z^2$ shim coils $SC1_M$, $SC2_M$, $SC3_M$, $SC4_M$, $SC5_M$, and $SC6_M$ of FIG. 11. Within the superconductive shim coil circuit 67M, the superconductive $Z^2$ shim coils $SC1_M$ through $SC6_M$ are electrically connected in a series between the two power nodes 140 and 144 with one or more lengths of superconductive wire 138. In this configuration, when the electric current $I_{SHIM}$ is persistently flowing in the superconductive shim coil circuit 67M during usual shimming operation, the modified superconductive $Z^2$ shim coils $SC1_M$ through $SC6_M$ are able to respectively generate the magnetic fields $B_{SC1m}$, $B_{SC2m}$, $B_{SC3m}$, $B_{SC4m}$, $B_{SC5m}$, and $B_{SC6m}$ for thereby cooperatively correcting the magnetic field $B_0$.

FIG. 13 is a table setting forth physical dimensions and characteristics of the modified set of superconductive $Z^2$ shim coils $SC1_M$ through $SC6_M$ incorporated in the modified superconductive shim coil circuit 67M of FIG. 12. As compared to the originally proposed superconductive $Z^2$ shim coils $SC1_O$ through $SC4_O$ physically characterized in FIG. 8, the modified superconductive $Z^2$ shim coils $SC1_M$ through $SC6_M$ have correspondingly different B1 and B2 characteristics, correspondingly different numbers of coil turns, and correspondingly different coils lengths as well. In general, the differing physical characteristics of the modified superconductive $Z^2$ shim coils $SC1_M$ through $SC6_M$, pursuant to the present invention, help ensure that the electric current $I_{SHIM}$ in the modified superconductive shim coil circuit 67M is not induced to rise to a predetermined unstable current level during a quench event in the multi-section protected superconductive magnet coil circuit 65P.

FIG. 14 is a table setting forth performance results of the modified superconductive shim coil circuit 67M in FIG. 12 that incorporates the modified set of superconductive $Z^2$ shim coils $SC1_M$ through $SC6_M$ characterized in FIG. 13. As indicated in the results tabulated in FIG. 14, the modified superconductive $Z^2$ shim coils $SC1_M$ through $SC6_M$ are reasonably effective in helping shim the generated magnetic field $B_0$ so as to make the overall, resultant magnetic field $B_0$ sufficiently homogeneous for high-quality imaging. In particular, with the help of the modified superconductive $Z^2$ shim coils $SC1_M$ through $SC6_M$, an overall homogeneity correction of −7.19 parts-per-million per ampere (ppm/A) over a spherical imaging volume (SV) having a 22.5-centimeter radius (i.e., a 45-centimeter diameter spherical imaging volume (DSV)) has been achieved. Given that a commensurate homogeneity correction of −7.19 ppm/A was also achieved with the above-discussed originally proposed superconductive Z2 shim coils $SC1_O$ through $SC4_O$ as shown in FIG. 9, the performance results in FIG. 14 demonstrate that the overall homogeneity of a magnetic field $B_0$ produced by a modern MRI system is not compromised when utilizing a superconductive shim coil circuit developed pursuant to the present invention.

Figure 15:
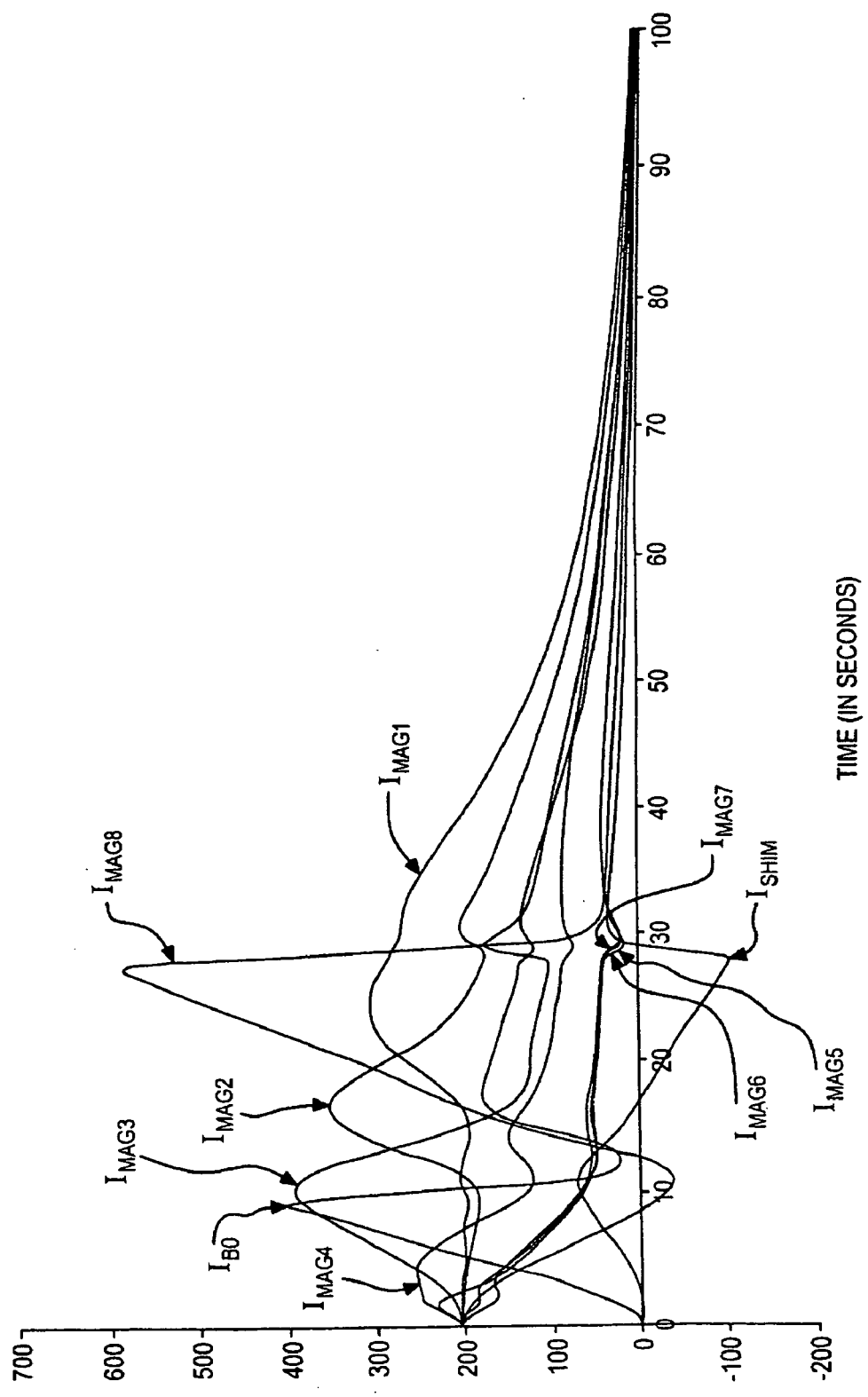
FIG. 15 is a graph illustrating resultant fluctuations in electric current levels both within individual sections of the multi-section protected superconductive magnet coil circuit of FIG. 5 and within the superconductive shim coil circuit of FIG. 12 during a quench event in the superconductive magnet coil circuit.

FIG. 15 graphically illustrates various tensive fluctuations in the levels of electric currents $I_{MAG1}$ through $I_{MAG8}$ respectively flowing through the individual protected sections 1 through 8 of the superconductive magnet coil circuit 65P during a quench event in the circuit 65P. In this particular example, the electric current $I_{MAG}$ in the superconductive magnet coil circuit 65P is being quenched from a current level of about 210 amperes (A) down to a current level of 0 A. As shown in the graph of FIG. 15, during the quenching of electric current $I_{MAG}$, one or more of the resultant tensive fluctuations in the levels of electric currents $I_{MAG1}$ through $I_{MAG8}$ flowing in superconductive magnet coil circuit 65P correspondingly induced only a modest fluctuation in the level of electric current $I_{SHIM}$ commonly flowing through the modified shim coils $SC1_M$ through $SC6_M$ of the modified superconductive shim coil circuit 67M. In this particular example, the modest fluctuation induced in electric current $I_{SHIM}$ peaked at a mere current level of about 100 A (absolute value). Peaking at such a low magnitude in current level in this manner is very desirable, for if such a modest current peak is less than the characteristic critical current ($I_{CRIT}$) inherently associated with the superconductive wire 138 in the superconductive shim coil circuit 67M, quenching of the electric current $I_{SHIM}$ in the circuit 67M is thereby successfully prevented. By preventing the electric current $I_{SHIM}$ from being quenched, significant amounts of thermal energy are not released from the superconductive shim coil circuit 67M. As an ultimate result, the modified shim coil circuit 67M, as well as other MRI hardware situated proximate thereto, is successfully protected from burnout and permanent damage.

In addition to the above, other strategies pursuant to the present invention may also be optionally implemented for preventing a superconductive shim coil circuit from being damaged during a quench event in a multi-section protected superconductive magnet coil circuit. One such optional strategy is fashioning the shim coils within the superconductive shim coil circuit from superconductive wire having a very low critical current ($I_{CRIT}$) characteristic or a low current-carrying capacity. For example, selecting superconductive wire with a critical current ($I_{CRIT}$) characteristic ranging from a mere 50 to 150 amperes (A) may be desirable in pursuit of certain design goals. In particular, by selecting low $I_{CRIT}$ superconductive wire in this manner, if even a modest fluctuation is induced in the level of electric current $I_{SHIM}$ flowing through a superconductive shim coil circuit during a quench event in a proximately situated superconductive magnet coil circuit, quenching of the electric current $I_{SHIM}$ in the superconductive shim coil circuit is thereby quickly initiated. In quickly initiating the quenching of electric current $I_{SHIM}$ at such a low current level, thermal energy is thereby "bled" (i.e., released) from the superconductive shim coil circuit at lower and safer energy levels. That is, initiating the quench (i.e., dissipation) of electric current $I_{SHIM}$ at a lower current level is, in some scenarios, significantly safer than waiting to initiate the quench at a much higher current level. In this way, any excess electric current induced in the superconductive shim coil circuit is prevented from accumulating up to a conventionally predetermined unstable current level before being quenched and released in the form of thermal energy from the circuit. As a result, sudden releases of high levels of thermal energy are prevented. In this way, the superconductive shim coil circuit, as well as any other MRI hardware situated proximate thereto, is protected from burnout and permanent damage.

Another optional strategy pursuant to the present invention for preventing a superconductive shim coil circuit from being damaged during a quench event in a multi-section protected superconductive magnet coil circuit involves the use of quench-inducing resistive heaters. In this strategy, a superconductive shim coil circuit pursuant to the present invention additionally includes one or more quench-inducing resistive heaters that are thermally coupled to one or more of the superconductive shim coils connected within the shim coil circuit. In addition to being thermally coupled to one or more of the superconductive shim coils in the superconductive shim coil circuit, each such quench-inducing resistive heater is also electrically connected in parallel with at least one of the superconductive magnet coils connected within a multi-section protected superconductive magnet coil circuit. For example, in the multi-section protected superconductive magnet coil circuit 65P of FIG. 5, such quench-inducing resistive heaters may be electrically connected in one or more of the resistive networks 106, 108, 114, 116, 122, 124, 130, and 132. Coupled and connected as such, each such quench-inducing resistive heater is thereby positioned and designed for voltage-activation by the multi-section protected superconductive magnet coil circuit 65P. Thus, if quenching is initiated in one of the superconductive magnet coils MC1 through MC16 that happens to be connected in parallel with one or more of such quench-inducing resistive heaters, the one or more quench-inducing resistive heaters will then accordingly initiate quenching in one or more of the shim coils within the superconductive shim coil circuit. In this way, the electric current $I_{SHIM}$ is prevented, in an anticipatory and preemptive fashion, from being induced to rise to a conventionally predetermined unstable current level during a quench event in the superconductive magnet coil circuit 65P. As a result, both the quenching of electric current $I_{SHIM}$ at such a predetermined unstable current level and the sudden consequent release of high levels of thermal energy are thereby prevented. In this way, the superconductive shim coil circuit, as well as any other MRI hardware situated proximate thereto, is protected from burnout and permanent damage.

While the present invention has heretofore been largely described in what is presently considered to be its most practical and preferred embodiment or implementation, it is to be understood that the invention is not to be limited to the particular embodiment disclosed hereinabove. On the contrary, the present invention is intended to cover various modifications and equivalent arrangements included within the spirit and scope of the claims appended hereinbelow, which scope is to be accorded the broadest interpretation so as to encompass all such modifications and equivalent structures as are permitted under the law.

Therefore, though the present invention has been described hereinabove as being directly applicable to and/or implementable with a set of superconductive $Z^2$ shim coils by way of example, it is to be understood that the present invention is also very much applicable to and/or implementable with numerous other function-specific sets of superconductive shim coils. In addition, though the present invention has been described hereinabove as being applicable to and/or implementable with superconductive shim coils by way of example, it is to be understood that the present invention is also applicable to and/or implementable with other types of complementary or secondary coils. Such other types of coils may include, for example, various magnetic field ($B_0$) "screening" coils, external interference shield (EIS) coils (sometimes simply called "$B_0$ shield coils") for shielding a generated magnetic field ($B_0$) from external disturbances, and the like. Lastly, though the present invention has been described hereinabove as being implementable within a magnetic resonance imaging (MRI) system by way of example, it is to be understood that the present invention is also implementable within many other types of magnet systems. Such other types of magnet systems may include, for example, nuclear magnetic resonance (NMR) spectroscopy systems, mass spectrometer systems, and similar others.

What is claimed is:

1. A secondary coil circuit for use with a multi-section protected superconductive magnet coil circuit in a system, said secondary coil circuit comprising:
   two circuit nodes;
   a ramping switch electrically connected between said two circuit nodes; and
   a number of secondary coils electrically connected between said two circuit nodes and comprising wire having substantially superconductive capability when cooled below a characteristic critical temperature level and conducting electric current below a characteristic critical current level;
   wherein said secondary coils are sized and positioned relative to the superconductive magnet coils situated in the individual sections of said multi-section protected superconductive magnet coil circuit so as to functionally cooperate with said multi-section protected superconductive magnet coil circuit in producing and maintaining a magnetic field that is substantially homogeneous.

2. A secondary coil circuit according to claim 1, wherein said system is selected from the group consisting of a magnetic resonance imaging (MRI) system, a nuclear magnetic resonance (NMR) spectroscopy system, and a mass spectrometer system.

3. A secondary coil circuit according to claim 1, wherein said two circuit nodes include two power connection terminals; and
wherein said secondary coil circuit further comprises an electric power supply switchably connected between said two power connection terminals.

4. A secondary coil circuit according to claim 1, wherein said ramping switch is a superconductive switch comprising:
a superconductive wire electrically connected between said two circuit nodes; and
an activatable resistive heater thermally coupled to said superconductive wire for controlling the effective resistance of said superconductive wire.

5. A secondary coil circuit according to claim 1, wherein said secondary coils are shim coils for shimming said magnetic field.

6. A secondary coil circuit according to claim 1, wherein said secondary coils are external interference shield (EIS) coils for shielding said magnetic field from external disturbances.

7. A secondary coil circuit according to claim 1, wherein said secondary coils are electrically connected in series between said two circuit nodes.

8. A secondary coil circuit according to claim 1, wherein said wire is composite wire having:
an inner filamentary core comprising superconductive material including a niobium-titanium alloy; and
an outer cladding layer comprising copper.

9. A secondary coil circuit according to claim 1, wherein said secondary coil circuit further comprises a burnout protection circuit electrically connected between said two circuit nodes; and
wherein said burnout protection circuit includes a circuit element selected from the group consisting of a resistor and a diode.

10. A secondary coil circuit according to claim 1, wherein said number, the physical characteristics, and the positions of said secondary coils are selected to cooperatively minimize mutual induction between each of said individual sections of said multi-section protected superconductive magnet coil circuit and said secondary coil circuit during a quench event in said multi-section protected superconductive magnet coil circuit for thereby preventing electric current in said secondary coil circuit from being induced to rise to a predetermined unstable current level.

11. A secondary coil circuit according to claim 10, wherein said physical characteristics of said secondary coils include coil length, coil inner radius, coil outer radius, coil axial location, coil wire length, coil wire diameter, coil wire material composition, number of coil turns, coil turn direction, and coil turn density.

12. A secondary coil circuit according to claim 10, wherein said predetermined unstable current level for said secondary coil circuit is substantially commensurate with said characteristic critical current level for said wire of said secondary coils.

13. A secondary coil circuit according to claim 1, wherein said secondary coil circuit has a predetermined unstable current level associated therewith; and
wherein said wire of said secondary coils is selected such that said characteristic critical current level for said wire is less than said predetermined unstable current level for said secondary coil circuit.

14. A secondary coil circuit according to claim 1, wherein said secondary coil circuit further comprises at least one quench-inducing resistive heater thermally coupled to at least one of said secondary coils.

15. A secondary coil circuit according to claim 14, wherein each said quench-inducing resistive heater is electrically connected in parallel with at least one of said superconductive magnet coils situated in said multi-section protected superconductive magnet coil circuit; and
wherein each said quench-inducing resistive heater is positioned and designed for voltage-activation by said multi-section protected superconductive magnet coil circuit to preemptively initiate quenching in said secondary coil circuit for thereby preventing electric current in said secondary coil circuit from being induced to rise to a predetermined unstable current level during a quench event in said multi-section protected superconductive magnet coil circuit.

16. A shim coil circuit for use with a multi-section protected superconductive magnet coil circuit in a cryogen vessel of a system, said shim coil circuit comprising:
two power nodes;
a ramping switch electrically connected between said two power nodes; and
a number of shim coils electrically connected in series between said two power nodes and comprising wire having substantially superconductive capability when cooled below a characteristic critical temperature level and conducting electric current below a characteristic critical current level;
wherein said shim coils are sized and positioned relative to the superconductive magnet coils situated in the individual sections of said multi-section protected superconductive magnet coil circuit for thereby shimming a magnetic field produced by said multi-section protected superconductive magnet coil circuit.

17. A shim coil circuit according to claim 16, wherein said shim coils are collectively positioned substantially circumjacent to said superconductive magnet coils of said multi-section protected superconductive magnet coil circuit within said cryogen vessel.

18. A shim coil circuit according to claim 16, wherein said number, the physical characteristics, and the positions of said shim coils are selected to cooperatively minimize mutual induction between the at least one superconductive magnet coil situated in each of said individual sections of said multi-section protected superconductive magnet coil circuit and said shim coils of said shim coil circuit during a quench event in said multi-section protected superconductive magnet coil circuit for thereby preventing electric current in said shim circuit from being induced to rise to a predetermined unstable current level.

19. A shim coil circuit according to claim 18, wherein said physical characteristics of said shim coils include coil length, coil inner radius, coil outer radius, coil axial location, coil wire length, coil wire diameter, coil wire material composition, number of coil turns, coil turn direction, and coil turn density.

20. A shim coil circuit according to claim 18, wherein said predetermined unstable current level for said shim coil circuit is substantially commensurate with said characteristic critical current level for said wire of said shim coils.

21. A shim coil circuit according to claim 16, wherein said shim coil circuit has a predetermined unstable current level associated therewith; and wherein said wire of said shim coils is selected such that said characteristic critical current level for said wire is less than said predetermined unstable current level for said shim coil circuit.

22. A shim coil circuit according to claim 16, wherein said shim coil circuit further comprises at least one quench-inducing resistive heater thermally coupled to at least one of said shim coils.

23. A shim coil circuit according to claim 22, wherein each said quench-inducing resistive heater is electrically connected in parallel with at least one of said superconductive magnet coils situated in said multi-section protected superconductive magnet coil circuit; and wherein each said quench-inducing resistive heater is positioned and designed for voltage-activation by said multi-section protected superconductive magnet coil circuit to preemptively initiate quenching in said shim coil circuit for thereby preventing electric current in said shim coil circuit from being induced to rise to a predetermined unstable current level during a quench event in said multi-section protected superconductive magnet coil circuit.

24. A method of installing a secondary coil circuit for use with a multi-section protected superconductive magnet coil circuit in a system, said method comprising the steps of:

(a) electrically connecting a ramping switch between two circuit nodes;

(b) obtaining secondary coils comprising wire having substantially superconductive capability when cooled below a characteristic critical temperature level and conducting electric current below a characteristic critical current level;

(c) electrically connecting a number of said secondary coils between said two circuit nodes; and (d) sizing and positioning said secondary coils relative to the superconductive magnet coils situated in the individual sections of said multi-section protected superconductive magnet coil circuit so that said secondary coils functionally cooperate with said multi-section protected superconductive magnet coil circuit in producing and maintaining a magnetic field that is substantially homogeneous.

25. A method of installing a secondary coil circuit according to claim 24, wherein said method further comprises the step of:

selecting said number, the physical characteristics, and the positions of said secondary coils to cooperatively minimize mutual induction between each of said individual sections of said multi-section protected superconductive magnet coil circuit and said secondary coil circuit during a quench event in said multi-section protected superconductive magnet coil circuit for thereby preventing electric current in said secondary coil circuit from being induced to rise to a predetermined unstable current level.

26. A method of installing a secondary coil circuit according to claim 24, wherein said method further comprises the steps of:

predetermining an unstable current level for said secondary coil circuit; and executing step (b) such that said characteristic critical current level for said wire of said secondary coils is less than said unstable current level predetermined for said secondary coil circuit.

27. A method of installing a secondary coil circuit according to claim 24, wherein said method further comprises the steps of:

electrically connecting at least one quench-inducing resistive heater in parallel with at least one of said superconductive magnet coils situated in said multi-section protected superconductive magnet coil circuit; and positioning each said quench-inducing resistive heater proximate to at least one of said secondary coils such that each said quench-inducing resistive heater is thermally coupled to at least one of said secondary coils.

* * * * *